US006974975B2

(12) United States Patent
Shizukuishi

(10) Patent No.: US 6,974,975 B2
(45) Date of Patent: Dec. 13, 2005

(54) SOLID-STATE IMAGING DEVICE, METHOD FOR DRIVING SOLID-STATE IMAGING DEVICE, AND METHOD FOR PROCESSING IMAGE SIGNAL

(75) Inventor: Makoto Shizukuishi, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 15 days.

(21) Appl. No.: 10/834,250

(22) Filed: Apr. 29, 2004

(65) Prior Publication Data
US 2005/0139845 A1 Jun. 30, 2005

(30) Foreign Application Priority Data
May 8, 2003 (JP) .............................. 2003-130731

(51) Int. Cl.[7] .............................................. H01L 33/00
(52) U.S. Cl. ..................... 257/98; 257/222; 257/232; 257/233; 257/291; 257/292; 348/322
(58) Field of Search ............................... 257/222, 232, 257/233, 291, 292; 348/322

(56) References Cited

U.S. PATENT DOCUMENTS

| 4,647,975 A |  | 3/1987 | Alston et al. |
| 5,420,635 A |  | 5/1995 | Konishi et al. |
| 5,455,621 A |  | 10/1995 | Morimura |
| 6,628,332 B1 | * | 9/2003 | Watanabe .................. 348/322 |

FOREIGN PATENT DOCUMENTS

| JP | 59-210775 A | 11/1984 |
| JP | 62-108678 A | 5/1987 |
| JP | 5-64083 A | 3/1993 |
| JP | 6-141229 A | 5/1994 |
| JP | 10-136391 A | 5/1998 |

OTHER PUBLICATIONS

C. H. Sequin, Blooming Suppression in Charge-Coupled Area Imaging Devices, Bell Syst. Tech. J., 51, pp. 1923-1926, 1972.
Yasuo Ishihara et al.; Interline CCD Image Sensor with Anti-Blooming Structure, ISSCC Dig., Tech. Papers, IEEE International Solid State Circuit Conference; pp. 168-169, 1982.

* cited by examiner

Primary Examiner—David Nelms
Assistant Examiner—Mai-Huong Tran
(74) Attorney, Agent, or Firm—Birch, Stewart, Kolasch & Birch, LLP

(57) ABSTRACT

A solid-state imaging device comprising: a semiconductor substrate having a first surface; and a plurality of light-receiving sections arranged in an array pattern on the first surface of the semiconductor substrate, the solid-state imaging device reading a stored electric charge in each of the light-receiving sections, wherein each of the light-receiving sections comprises: a first signal electric charge storage section that stores a first signal electric charge corresponding to an incident light energy; and a second signal electric charge storage section that stores at least part of an excessive electric charge, the at least part of the excessive electric charge being captured from the first signal electric charge storage section, when the electric charge stored in the first signal electric charge storage section exceeds a saturated electric charge amount of the first signal electric charge section to form the excessive electric charge.

16 Claims, 16 Drawing Sheets

SOLID-STATE IMAGING DEVICE, METHOD FOR DRIVING SOLID-STATE IMAGING DEVICE, AND METHOD FOR PROCESSING IMAGE SIGNAL

This Non-provisional application claims priority under 35 U.S.C. § 119(a) on Patent Application No(s). 2003-130731 filed in Japan on May 8, 2003, the entire contents of which are hereby incorporated by reference.

BACKGROUND OF THE INVENTION

1. Field of the Invention

The present invention relates to a solid-state imaging device, such as a CCD, and more particularly, to a solid-state imaging device having a wide dynamic range.

2. Description of the Related Art

When an object is photographed by using a solid-state imaging device, such as a CCD sensor or a CMOS sensor, there is desirably prevented changing of a higher-intensity portion of a photographed image into saturated white level or changing of a lower-intensity portion of the same into black or dark level. Specifically, in order to enable photographing of an image from a lower-intensity range to a higher-intensity range, the solid-state imaging device or a signal processing circuit must attain a wide dynamic range.

To this end, various methods for expanding the dynamic range of the solid-state imaging device have hitherto been proposed. For instance, according to a related-art technique described in JP-A-59-210775, both high-sensitivity pixels and low-sensitivity pixels are provided on the surface of the CCD sensor, and images captured by the high-sensitivity pixels and images captured by the low-sensitivity pixels are merged together, to thereby achieve a wide dynamic range.

A conceivable method for creating a difference between the high-sensitivity pixels and the low-sensitivity pixels includes, e.g., amethod for stacking an ND filter on the pixels of one type and a method for narrowing openings of light-shielding films provided on the pixels of one type. However, the high-sensitivity pixels and the low-sensitivity pixels are adjacently provided on the surface of the solid-state imaging device, and hence there arises a problem of a sensitivity ratio of the high-sensitivity pixels to the low-sensitivity pixels changing depending on the angle of light entering the surface of the solid-state imaging device or the distribution of light intensity.

According to a related-art technique described in JP-A-62-108678 (corresponding to U.S. Pat. No. 4,647,975), a single image is photographed twice by using the solid-state imaging device, and the thus-photographed images are merged together, to thus widen the dynamic range. Specifically, according to this related-art technique, a difference in sensitivity is achieved by means of a period of exposure time. A low-sensitivity image signal obtained by means of a short period of exposure time (i.e. a short period of storage time) and a high-sensitivity image signal obtained by means of a long period of exposure time (i.e., a long period of storage time) are merged together. However, according to this related-art technique, there exists a time difference between image data stemming from exposure of a short period of time and image data stemming from exposure of a long period of time. Particularly when a still image is photographed, there arises a problem of the technique being unsuitable for photographing a moving object, high-speed shutter operation, or strobo-light photographing.

According to related-art techniques described in JP-A-5-64083 and JP-A-6-141229 (corresponding to U.S. Pat. No. 5,420,635 and U.S. Pat. No. 5,455,621, respectively), a signal is processed such that a characteristic curve of high-sensitivity image data and a characteristic curve of low-sensitivity image data are smoothly connected together. As a result, the high-sensitivity image data are mainly used in a low-exposure energy domain, and low-sensitivity image data are mainly used in a high-exposure energy domain. Thus, an exposure energy value at which the output signal becomes saturated is shifted toward a higher exposure energy level than that achieved conventionally, to thereby attain a wider dynamic range.

When an attempt is made to widen the dynamic range of the CCD sensor by means of increasing the area of the light-receiving sections on the surface of the semiconductor substrate, to thus increase the amount of saturated electric charges, there is required a vertical transfer CCD capable of transferring electric charges which are equal in amount to the saturated electric charges. Specifically, when the area of the light-receiving sections is increased, there arises a necessity for increasing the quantity of electric charges transferred over the vertical transfer channel; e.g., a necessity for broadening the width of the transfer channel. Accordingly, when the chip size of the semiconductor substrate cannot be increased, there exists a limitation; that is, the difficulty in enlarging unilaterally the area of the light-receiving sections. Moreover, an increase in the amount of electric charges to be transferred and the transfer speed of electric charges raise another problem of an increase in the power consumed at the time of driving of the CCD.

An increase in the number of pixels resulting from miniaturization pixels conversely results in a situation there is no other way but to reduce the area of the light-receiving sections. For this reason, there is faced a problem of a further decrease in the amount of signal electric charges which can be handled. Noise components included in an output signal do not decrease proportionately with miniaturization of pixels.

When compared with a silver halide film, the solid-state imaging device is aid to be narrower in latitude (allowance) to exposure energy. For instance, when electric charges exceeding the amount of electric charges which can be stored in the light-receiving sections have arisen as a result of strong light having entered the solid-state imaging device, overflowed electric charges flow into adjacent pixels where no light enters, which in turn induces a known blooming phenomenon of a white area spreading with the area where the light has fell being taken as a center.

In order to improve the blooming phenomenon, there has hitherto been adopted a structure which discharges excessive electric charges to the outside before inflow of excessive electric charges into adjacent light-receiving sections. For instance, an example structure is described in C.H. Sequin Blooming Suppression in Charge-Coupled Area Imaging Devices, Bell Syst. Tech. J., 51, pp. 1923 to 1926 (1972). Specifically, in this structure, another electric charge storage area—which is called an overflow drain (OD) and identical in conductivity type with the electric charge storage section of the light-receiving section—is disposed beside the electric charge storage section. Excessive electric charges are collected into the overflow drain, and the thus-collected electric charges are wiped out of the device. This structure is generally called a lateral overflow drain (LOD), and the blooming phenomenon is greatly lessened by this structure.

However, when the lateral overflow drain structure is adopted for the CCD, overflow drains must be laid in a lattice pattern over the entire chip of the semiconductor substrate, which in turn raises a problem of an increase of the chip size.

As described in Y. Ishihara et al. "Interline CCD Image Sensor with Anti-Blooming Structure," ISSCC Dig., Tech. Papers, pp. 168–169 (1982), a vertical overflow drain (VOD) has been developed. An $N^+$/P-Well/N-substrate structure is formed in a depth-wise direction of a light-receiving section of substrate, to thus cause excessive electric charges to over-flow down to the substrate. Specifically, a bias voltage is applied between an n-type substrate and a P well layer formed in the substrate, thereby discharging the excessive electric charges overflowed from potential wells of the light-receiving sections to the n-type substrate.

In the vertical overflow drain structure, it is easy to uniformly control the substrate potential of the respective light-receiving sections, and hence the overflow level can be controlled by the applying substrate voltage or the voltage pulse width and timing. Since the area of the chip is not sacrificed, substantially all of the current CCDs adopt the vertical overflow drain structure, thereby significantly lessening a phenomenon called blooming or smear attributable to excessive incident light.

However, even when the CCD is provided with the overflow drain structure, an output signal level corresponding to incident light which exceeds a given quantity of light, is saturated. Hence, a signal difference (i.e., dynamic range of highlight level and dark level) cannot be determined over a wide range of incident light energy, which still remains a cause of narrowing the latitude.

SUMMARY OF THE INVENTION

The object of the present invention is to provide a solid-state imaging device having a structure for increasing the amount of saturated electric charges—which can be handled without an increase in the width of an electric charge transfer path—, to thus enable broadening of a dynamic range.

The present invention provides a solid-state imaging device comprising: a semiconductor substrate having a first surface; and a plurality of light-receiving sections arranged in an array pattern on the first surface of the semiconductor substrate, the solid-state imaging device reading a stored electric charge in each of the light-receiving sections, wherein each of the light-receiving sections comprises: a first signal electric charge storage section that stores a first signal electric charge corresponding to an incident light energy; and a second signal electric charge storage section that stores at least part of an excessive electric charge, at least part of the excessive electric charge being captured from the first signal electric charge storage section, when the electric charge stored in the first signal electric charge storage section exceeds a saturated electric charge amount of the first signal electric charge section to form the excessive electric charge.

By means of this configuration, the amount of saturated electric charges which can be handled without increasing the width of the electric charge transfer channel can be increased, thereby broadening a dynamic range.

There is provided the solid-state imaging device, wherein the second signal electric charge storage section is disposed adjacent to the first signal electric charge storage section isolated from a potential barrier, on the first surface of the semi conductor substrate. By means of this configuration, designing of the solid-state imaging device is facilitated.

There is provided the solid-state imaging device further comprising: a P-well layer on the semiconductor substrate; a first.charge transfer (read) gate section for the first signal electric charge storage section; and a second charge transfer (read) gate section for the second signal electric charge storage section, wherein the impurity dopant concentration in the potential barrier is higher than the impurity dopant concentration in the P-well layer, and lower than each of the impurity dopant concentrations of the first and second read gate sections. By means of this configuration, adjustment of the amount of electric charges stored in the second signal electric charge storage section becomes easy.

There is provided the solid-state imaging device further comprising: a first read gate section for the first signal electric charge storage section; and a second read gate section for the second signal electric charge storage section, wherein the impurity dopant concentration in the potential barrier has the same level of each of the impurity dopant concentrations of the first and second read gate sections. By means of this configuration, diffusion of excessive electric charges having passed through the potential barrier is prevented.

There is provided the solid-state imaging device, wherein the second signal electric charge storage section is disposed vertically in a depth direction of the first signal electric charge storage section with respect to the semiconductor substrate. By means of the configuration, portions of the excessive electric charges discarded by the vertical overflow drain structure can be captured and stored in the second signal electric charge storage section.

There is provided the solid-state imaging device further comprising: a second read gate section for the second signal electric charge storage section, wherein the second signal electric charge storage section has a impurity dopant profile that the impurity dopant concentration near the second read gate is higher than that of a deeper portion of the second signal electric charge storage section. By means of this configuration, reading of the signal electric charges from the second signal electric charge storage section formed in a deep location in the substrate with complete electric charges transfer is facilitated.

There is provided the solid-state imaging device, wherein the solid-state imaging device is an electric-charge coupled device (CCD); wherein the solid-state imaging device comprises first and second read gate sections corresponding to the first and second signal electric charge storage sections, respectively; and wherein the first and second read gate sections are disposed separately from each other. By means of this configuration, reading of signal electric charges becomes easy.

There is provided the solid-state imaging device further comprising a light-shielding film having at least one opening section, wherein the second signal electric charge storage section is disposed at a position that is below the light-shielding film and avoids each of the at least one opening section. By means of this configuration, there can be avoided accumulation of electric charges, which would otherwise be caused after photoelectric conversion having been performed in the second signal electric charge storage section.

There is provided the solid-state imaging device, wherein the second signal electric charge storage section is disposed so as to surround the first signal electric charge storage section. By means of this configuration, manufacture of the solid-state imaging device becomes easy.

There is provided the solid-state imaging device, wherein the second signal electric charge storage section is smaller in area than the first signal electric charge storage section.

Employment of this configuration facilitates control of the width of the dynamic range with an area ratio.

There is provided the solid-state imaging device further comprising: an on-chip micro-lens array provided above each of the plurality of light-receiving sections; and a light-shielding film having at least one opening section, each of the at least one opening section corresponding to each of the plurality of light-receiving sections. By means of this configuration, a loss in incident light is minimized, thereby rendering the solid-state imaging device highly sensitive.

There is provided the solid-state imaging device, wherein the light-receiving sections are arranged in a honeycomb pattern. By means of this configuration, a progressive CCD can be embodied employing conventional two-layer polysilicon layer structure.

There is provided a method for driving any one of the solid-state imaging device, comprising reading a first electric charge signal in the first signal electric charge storage section and a second electric charge signal in the second signal electric charge storage section, independently. By means of this configuration, independently-read signal electric charges can be subjected to a signal processing, and to generate a characteristic curve of the input energy level vs. signal output voltage. These signal processing algorithm and characteristic curve are readily matched with system and user's requirements.

There is provided the method for driving, wherein the first electric charge signal and the second electric charge signal are separately and frame-sequentially read to a vertical transfer channel and then independently transferred and output to the vertical horizontal transfer channel and a horizontal transfer channel. Employment of this configuration facilitates broadening a dynamic range by means of merging of two frame images matching system or user's requirements.

There is provided a method for processing an image signal by use of a first output signal from the first signal electric charge storage section and a second output signal from the second signal electric charge storage section in the method for driving, the method for processing comprising: merging the first output signal into the second output signal with respect to each of the light-receiving sections, because the second signal electric charge storage section has no signal charges stored before the first signal electric charge storage section being saturated. By means of this configuration, signal processing circuit performs simple adding sequence without complicated signal processing algorithm, and hence there can be obtained a photographed image having a wide dynamic range.

There is provided the method for driving, wherein the first electric charge signal and the second electric charge signal are read to a vertical transfer channel to cause a mixed signal, where the first and second electric charge signals are mixed together in the vertical transfer channel; and wherein the mixed signal is transferred down to the horizontal transfer channel, and is output from the solid-state imaging device. By means of this method, signal processing can be simplified.

DETAILED DESCRIPTION OF THE INVENTION

Embodiments of the invention will be described hereinbelow by reference to the drawings.

First Embodiment

Figure 1:
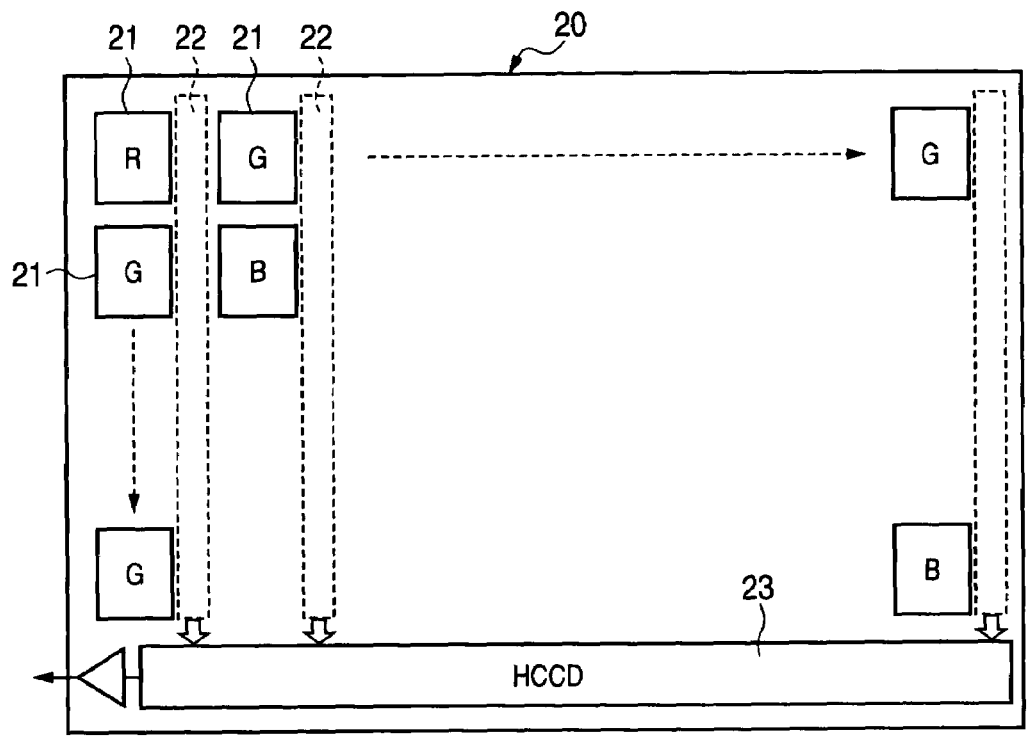
FIG. 1 is a schematic view of a surface of a CCD color solid-state imaging device according to a first embodiment of the invention.

FIG. 1 is a schematic view of a CCD color solid-state imaging device of single (chip) type according to a first embodiment of the invention. In the drawings, each of light-receiving sections 21 is represented as a rectangular shape. A plurality of the light-receiving sections 21 are arranged in an array pattern on the surface of a semiconductor substrate 20. In the embodiment, the light-receiving sections 21 are arranged in a square lattice pattern. A vertical transfer channel 22 is formed between horizontally-adjacent light-receiving sections 21, and the signal electric charges read from the light-receiving sections 21 to the vertical transfer channel 22 are transferred to a horizontal transfer channel 23 provided in a lower position.

In FIG. 1, reference symbols "R," "G," and "B" provided within the light-receiving sections 21 denote colors [i.e., red (R), green (G), and blue (B)] of the color filters provided on top of the respective light-receiving sections 21. In the present embodiment, columns are formed by longitudinally (vertically) arranging alternately rows; namely, rows formed by laterally (i.e., horizontally) arranging alternately light-receiving sections capable of reading signal electric charges according to the quantity of incident red (R) light and light-receiving sections capable of reading signal electric charges according to the quantity of green (G) incident light; and rows formed by alternately arranging, in a lateral direction, light-receiving sections capable of reading signal electric charges according to the quantity of green (G) incident light and light-receiving sections capable of reading signal electric charges according to the quantity of blue (B) incident light.

Figure 2:
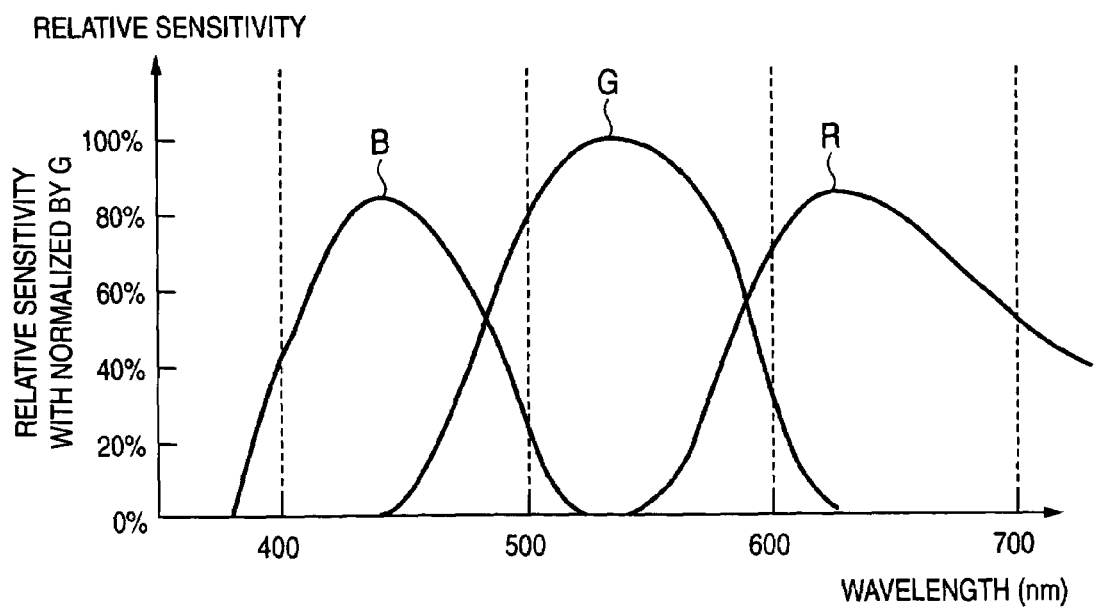
FIG. 2 is a graph showing an example spectral sensitivity of the color solid-state imaging device shown in FIG. 1.

FIG. 2 is a graph showing wavelength dependency of photo-electric conversion characteristics of the light-receiving sections equipped with color filters. The vertical axis shows relative sensitivity normalized by intensity of G signal.

Figure 3:
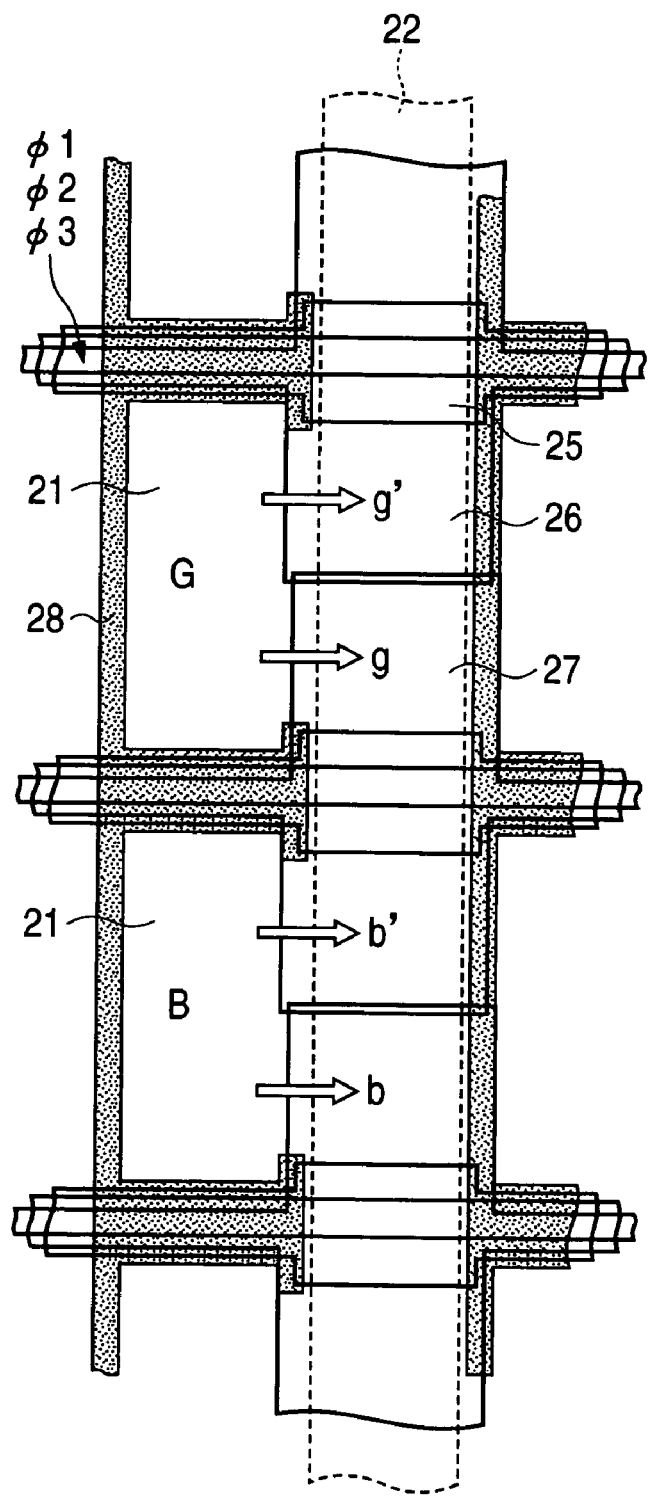
FIG. 3 is a schematic plan view of two pixels arranged in the vertical direction of the solid-state imaging device shown in FIG. 1.

FIG. 3 is a view showing transfer electrodes of the color solid-state imaging device of the embodiment; that is, a plan view of two pixels (a G light-receiving section and a B light-receiving section in the illustrated embodiment) arranged in the vertical direction shown in FIG. 1. In the embodiment, transfer electrodes 25, 26, and 27 assume a three-layered poly-silicon structure and constitute an inter-line CCD capable of progressive reading mode.

The respective light-receiving section 21 arranged consecutively in the vertical direction are defined by a comb-shaped device isolation 28, wherein openings are formed on the right side of the element isolation 28 so as to face the vertical transfer channel 22 in the illustrated embodiment. The second poly-silicon electrode 26 or the third poly-silicon electrode 27 forms a read gate electrode. When a read voltage is applied to the respective read gate electrodes, signal electric charges are read from corresponding signal electric charge storage sections to the vertical transfer channel 22.

In the embodiment shown in FIG. 3, signal electric charges "g" and "g" are read from the green (G) light-receiving section to the vertical transfer channel 22. Signal electric charges "b" and "b" are read from the blue (B) light-receiving section 21 to the vertical transfer channel 22. Although omitted from the drawings, signal electric charges "r" and "r" are read from the red (R) light-receiving sections to the vertical transfer channel 22.

Figure 4:
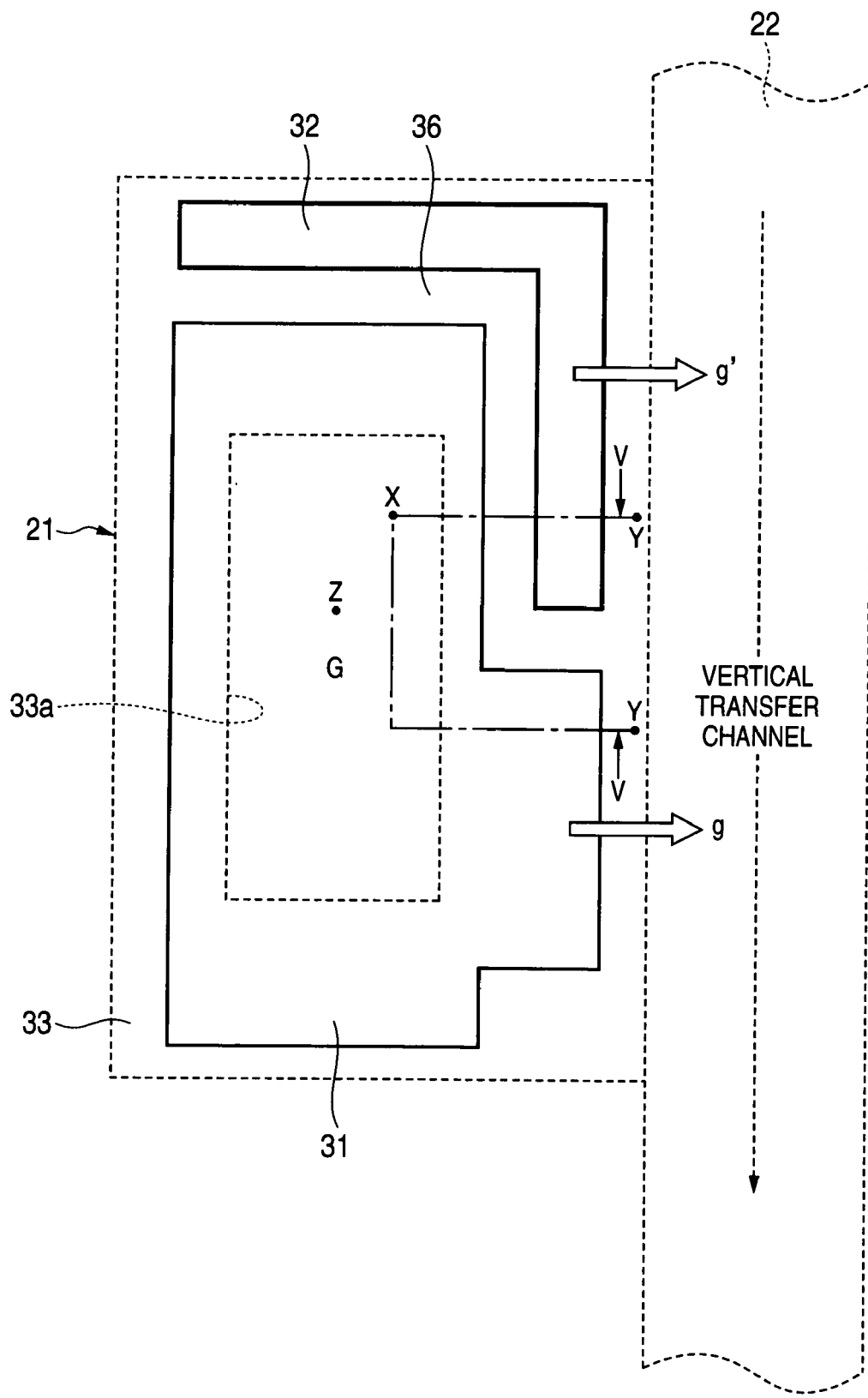
FIG. 4 is a detailed schematic plan view of one pixel of the solid-state imaging device shown in FIG. 1.

FIG. 4 is a detailed schematic plan view of one light-receiving section 21. The R, G, and B light-receiving sections have identical structures. In FIG. 4, the structure of the green light-receiving section is described as an example.

The light-receiving section 21 has a first signal electric charge storage section 31 and a second signal electric charge storage section 32. A signal electric charge "q" (corresponding to any one of "r," "g," and "b") is read from the first signal electric charge storage section 31, and a signal electric charge q' (corresponding to any one of "r'," "g'," and "b'") is read from the second signal electric charge storage section 32. The light-receiving section 21 is coated with a light-shielding film 33, and an optical opening section 33a of the light-shielding film 33 is formed in only an upper portion of the first signal electric charge storage section 31.

The electric charge "q" is stored in the first signal electric charge storage section 31 in accordance with the quantity of light entering the same byway of the opening section 33a. When the electric charge stored in the first signal electric charge storage section 31 has become saturated, a portion q' of excess electric charges having overflowed from the first signal electric charge storage section 31 migrates to the second signal electric charge storage section 32. The remaining excess electric charges having overflowed from the first signal electric charge storage section 31 are discarded to the substrate by way of the vertical overflow drain structure.

Figure 5:
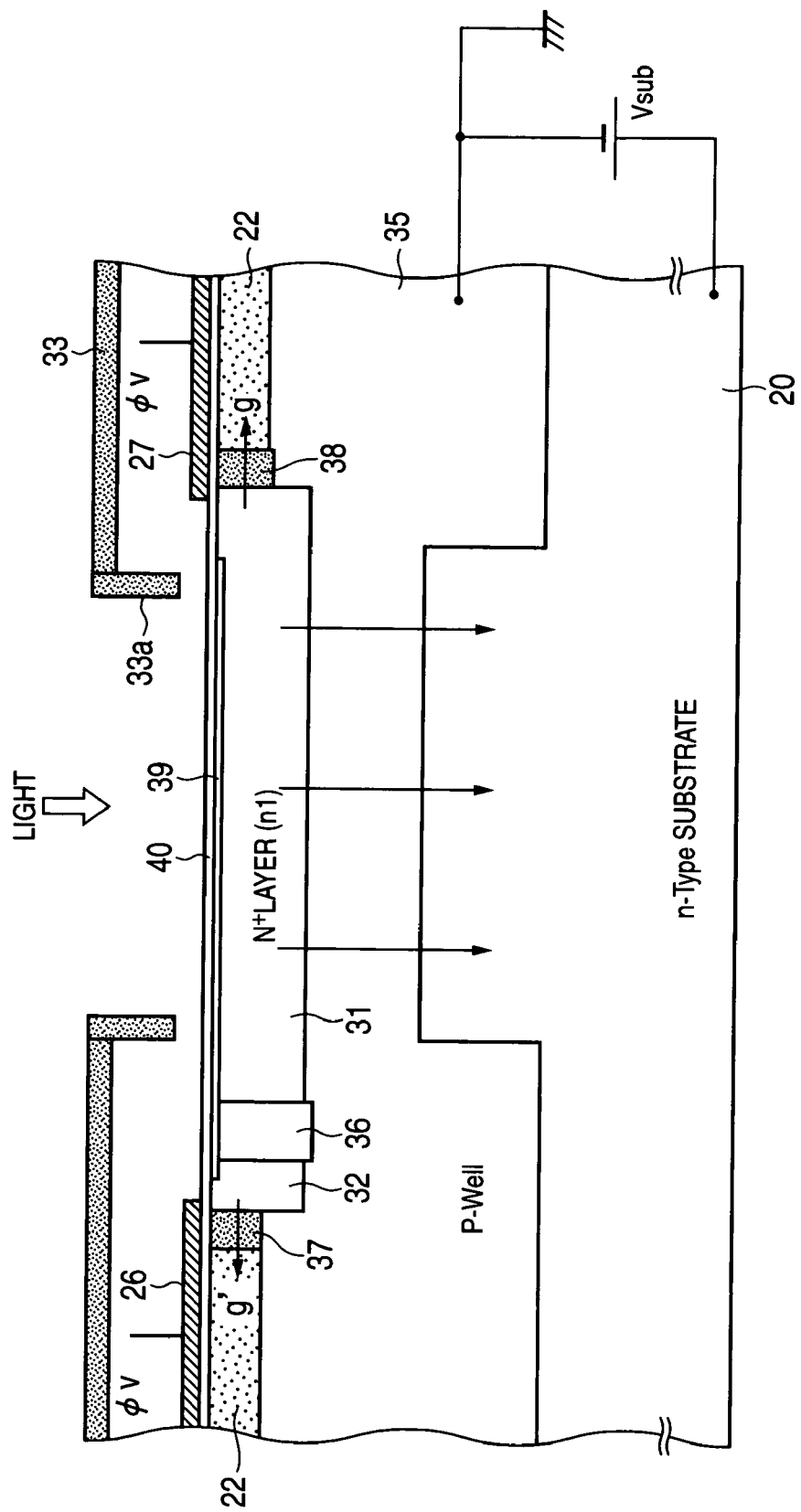
FIG. 5 is a cross-sectional view taken along line V—V shown in FIG. 4.

FIG. 5 is a cross-sectional view taken along line V—V shown in FIG. 4. The CCD color solid-state imaging device of the embodiment is fabricated in the n-type semiconductor substrate 20. A P well layer 35 is formed on the surface of the n-type semiconductor substrate 20, and the first signal electric charge storage section 31 is formed on the surface portion of the P well layer 35. The first signal electric charge storage section 31 is formed from an $N^+$ region (an n1 layer), and signal electric charges corresponding to incident light energy are stored in the first signal electric charge storage section 31.

The second signal electric charge storage section 32 formed at a light-shielded position, the position being covered with the light-shielding film 33 and offset from the opening section 33a, is formed from an $N^+$ region. The first signal electric charge storage sections 31 and 32 are separated from each other by means of a semiconductor layer 36 of the opposite conductive type; that is, P type. In the embodiment, the P type conductor layer 36 is also provided at the light-shielded position. A read gate section 37 formed from a $P^+$ region is formed between the second signal electric charge storage section 32 and an embedded channel constituting the vertical transfer channel 22. A read gate section 38 formed from a $P^+$ region is formed between the first signal electric charge storage section 31 and the embedded channel constituting the vertical transfer channel 22. The read electrode 26 is extended to a position where it covers the read gate section 37, and the read electrode 27 is extended to a position where it covers the read gate section 38.

The greater portion of the first signal electric charge storage section 31 is covered with a surface $P^+$ layer 39, and an $SiO_2$ film 40 is provided on the outermost surface of the $P^+$ layer 39. The light-shielding film 33 is provided at a position above the $SiO_2$ film 40, and an unillustrated color filter and an unillustrated micro-lens are disposed at positions much above the light-shielding film 33. The P well layer 35 is formed so as to protrude from a position where the first signal electric charge storage section 31 is formed, to become close to the same. The majority of the excessive electric charges having overflowed from the first signal electric charge storage section 31 are immediately discarded to the substrate 20 by means of a bias voltage Vsub applied between the substrate 20 and the P well layer 35.

The concentration of impurity dopants in the first signal electric charge storage section 31 and the concentration of impurity dopants in the second signal electric charge storage section 32 are set to, e.g., $5\times10^{16}$ to $1\times10^{18}/cm^3$. The concentration of impurity dopants in the semiconductor layer 36 of the opposite conductivity type; that is, P type, is set so as to become higher than the concentration of impurity dopants in the P well layer 35 and lower than the concentrations of impurity dopants in the read gate sections 37, 38. The concentration of impurities in the P well layer 35 is set to, e.g., $1\times10^{14}$ to $5\times10^{15}/cm^3$, and the concentrations of impurity dopants in the read gate sections 37, 38 are set to, e.g., $5\times10^{15}$ to $1\times10^{17}/cm^3$.

As mentioned previously, the solid-state imaging device of the embodiment has a structure in which the first and second signal electric charge storage sections 31, 32 read stored electric charges to the vertical electric charge transfer channel 22 by way of different read gate sections 38, 37. As can be seen from a planar shape of the second signal electric charge storage section 32 in FIG. 4, the second signal electric charge storage section 32 is formed so as to be adjacent to the first signal electric charge storage section 31 of the light-receiving section 21 and to assume a given area.

As mentioned above, in the embodiment, the second signal electric charge storage section 32 is formed on the surface of the semiconductor substrate 20, and hence the second signal electric charge storage section 32 can be provided adjacent to the first signal electric charge storage section 31 by means of changing only a layout pattern forming the light-receiving section 21. Specifically, a merit is yielded in terms of manufacture; that is, the ability to simultaneously form the first and second signal electric charge storage sections 31, 32 during wafer processing. Since the area of the second signal electric charge storage section 32 can be designed and modified before wafer processing in accordance with a preset amount of saturated exposure light energy.

Figure 6:
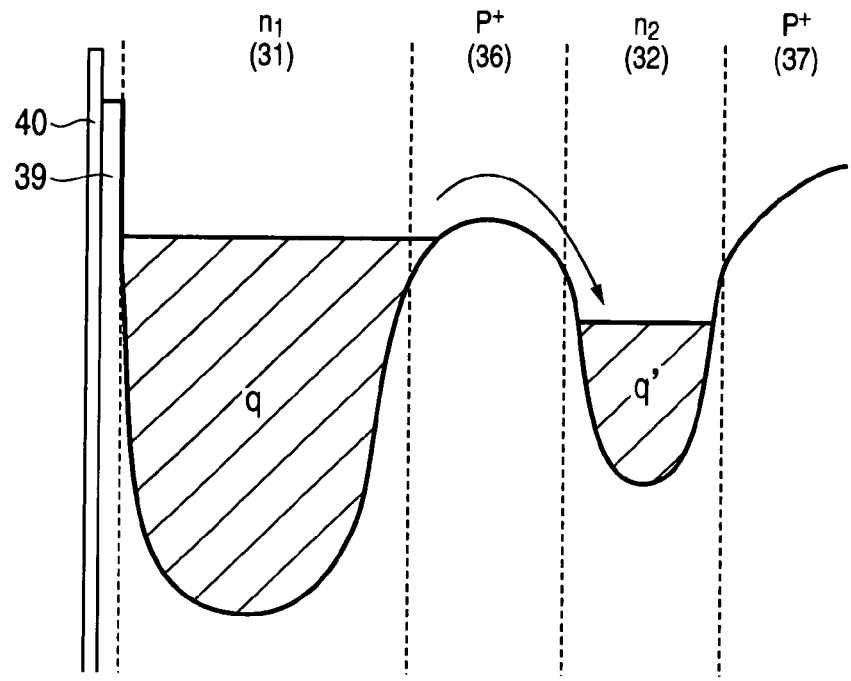
FIG. 6A is a view showing a potential profile existing in the direction of X–Y line shown in FIG. 4.
FIG. 6B is a view showing a potential profile existing in a depth-wise direction of a substrate at a point Z shown in FIG. 4.
Figure 6:
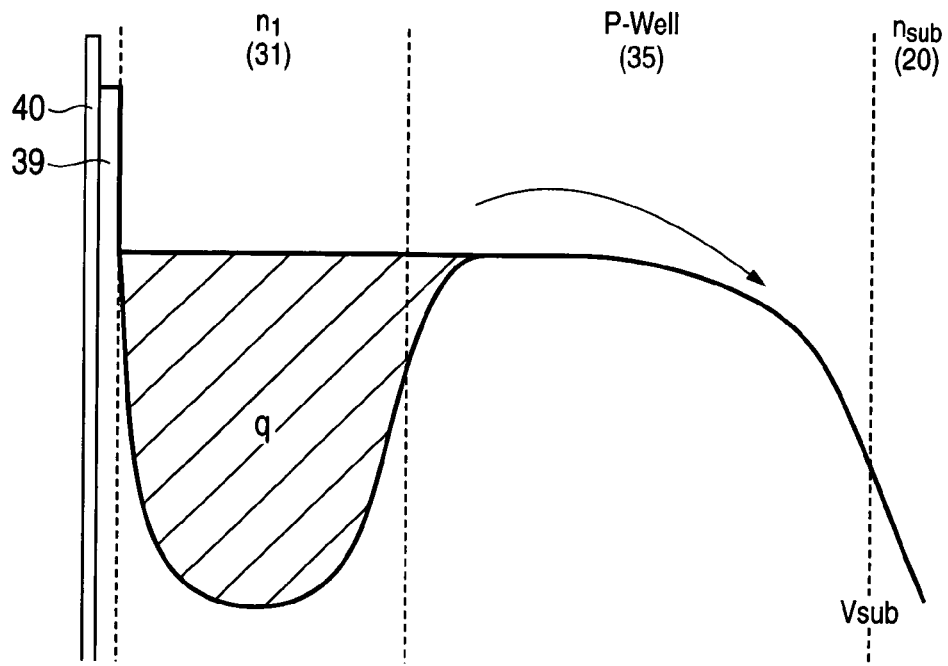

FIG. 6A shows a potential profile extending from a point X toward a point Y shown in FIG. 4 (i.e., a transverse direction of the substrate). FIG. 6B shows a view showing a potential profile achieved at a point Z shown in FIG. 4 in the depth-wise direction of the substrate. As shown in FIG. 6A, the electric charge "q" is stored in the first signal electric charge storage section 31. When the electric charge "q" has exceeded the amount of saturated electric charges of the first signal electric charge storage section 31, a portion "q'" of the excess electric charges migrates through the $P^+$ layer 36 by means of diffusion and is stored in the second signal electric charge storage layer 32.

As shown in FIG. 6B, at the point Z, the excess electric charges having overflowed from the first signal electric charge storage section 31 are discharged to the substrate 20 in their present forms by means of the vertical overflow drain structure consisting of the n1 layer 31, the P well layer 35, and the n-type substrate 20.

Figure 7:
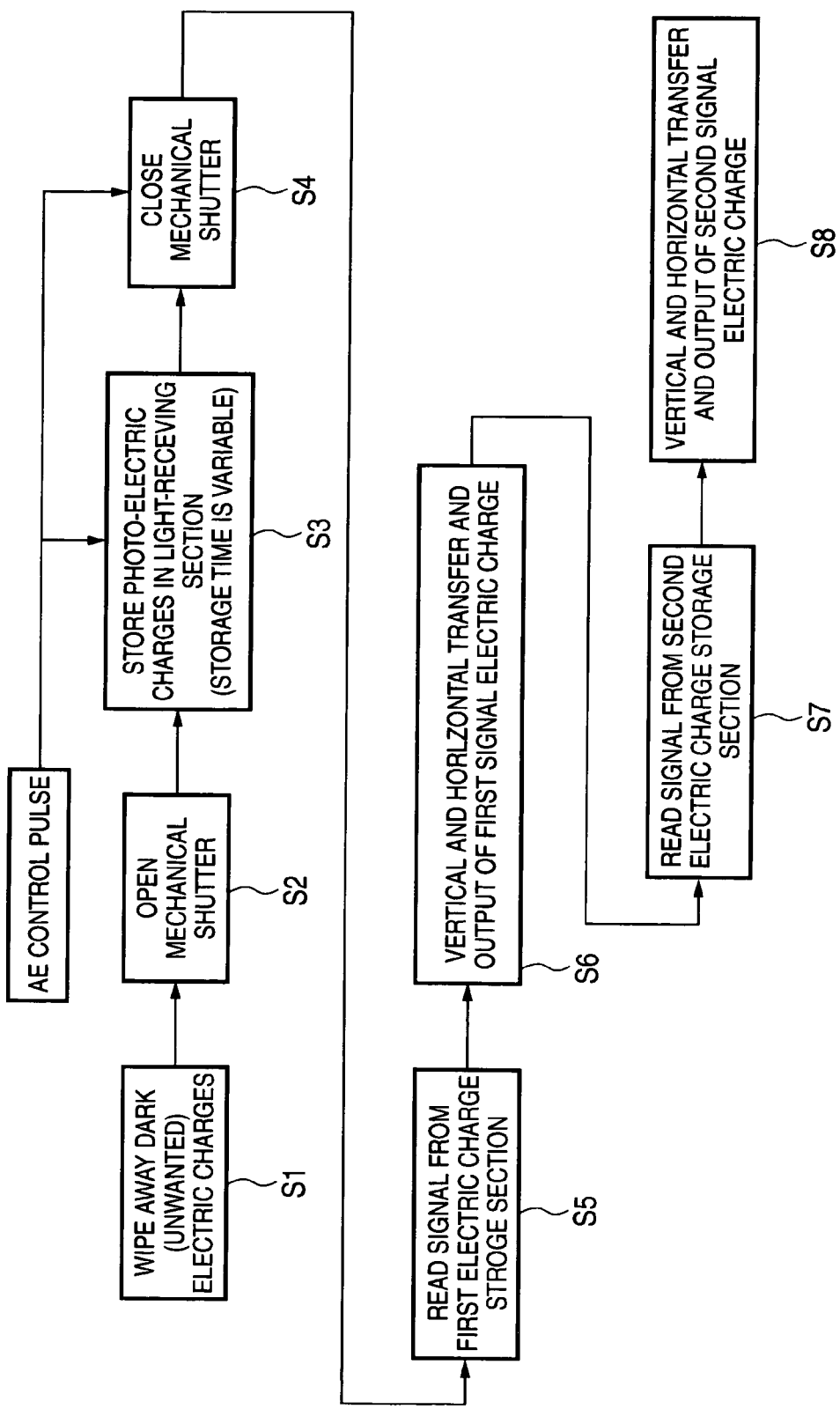
FIG. 7 is a view showing an example of imaging sequence of a digital still camera equipped with the solid-state imaging device shown in FIG. 1.

FIG. 7 is a sequence diagram used when an object is photographed by means of the digital still camera equipped with the solid-state imaging device of the previously-described embodiment. In the digital still camera equipped with the solid-state imaging device of the embodiment, dark electric charges remaining in the vertical transfer channel; that is, unwanted electric charges, are first wiped away or read out (step S1). Next, a mechanical shutter is brought into an "OPEN" position, whereupon exposure is commenced (step S2). As a result, the signal electric charge "q" corresponding to the quantity of light entering the light-receiving section (first signal electric charge storage section 31) is stored. When the signal electric charge "q" has exceeded the amount of saturation, a portion "q'" of the excess electric charges is stored in the second signal electric charge storage section 32 (step S3).

After lapse of an exposure time which has been determined by automatic exposure control, the mechanical shutter is brought into an "OFF" position (step S4). In the present embodiment, the electric charge "q" stored in the first signal electric charge storage section 31 is read (step S5), and this signal electric charge "q" is transferred over the vertical and horizontal transfer channels and output from the solid-state imaging device (step S6).

Next, the electric charge "q'" stored in the second signal electric charge storage section 32 is read (step S7). This signal electric charge "q'" is transferred over the vertical and horizontal transfer channels and output from the solid-state imaging device (step S8).

Figure 8:
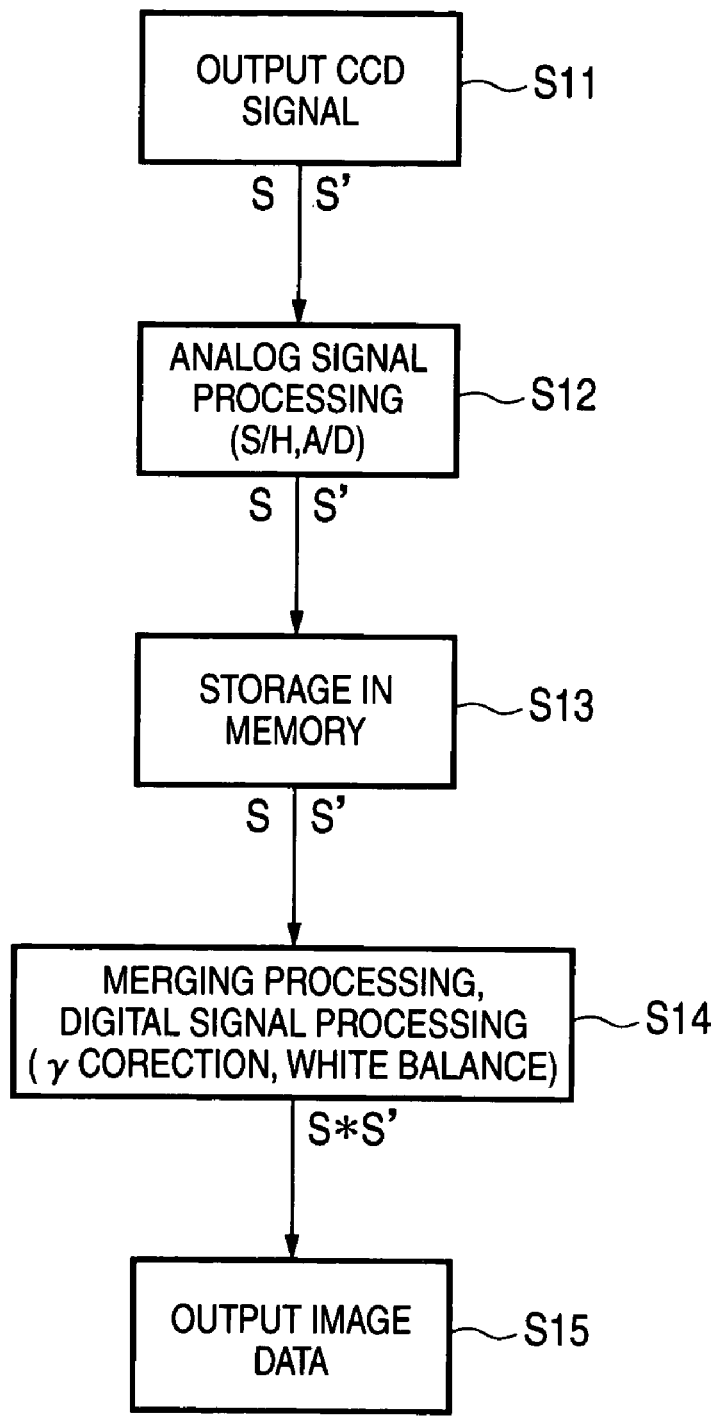
FIG. 8 is a flow chart showing an example of signal processing means of the digital still camera equipped with the solid-state imaging device shown in FIG. 1.

FIG. 8 is a flowchart showing signal processing procedures of the digital still camera. When the signal output voltage S and S' corresponding to signal electric charges "q" and "q'" respectively are output in steps S6, S8 described in connection with FIG. 7 (step S11), the output signal voltages "S" and "S'" are subjected to analog signal processing (e.g., sample-and-hold processing or analog-to-digital conversion processing) (step S12), and the pixel data obtained from signals "S" and "S'" of the respective pixels are stored in memory (step S13).

The image data processed using output signal voltages "S" and "S'," which are stored in the memory, are merged smoothly over low light intensity level to high light intensity level by an unillustrated digital signal processing circuit. The resultant signal is further subjected to gamma correction and white balance correction, to thus generate image data (step S14). Finally, the image data are output (step S15).

Figure 9:
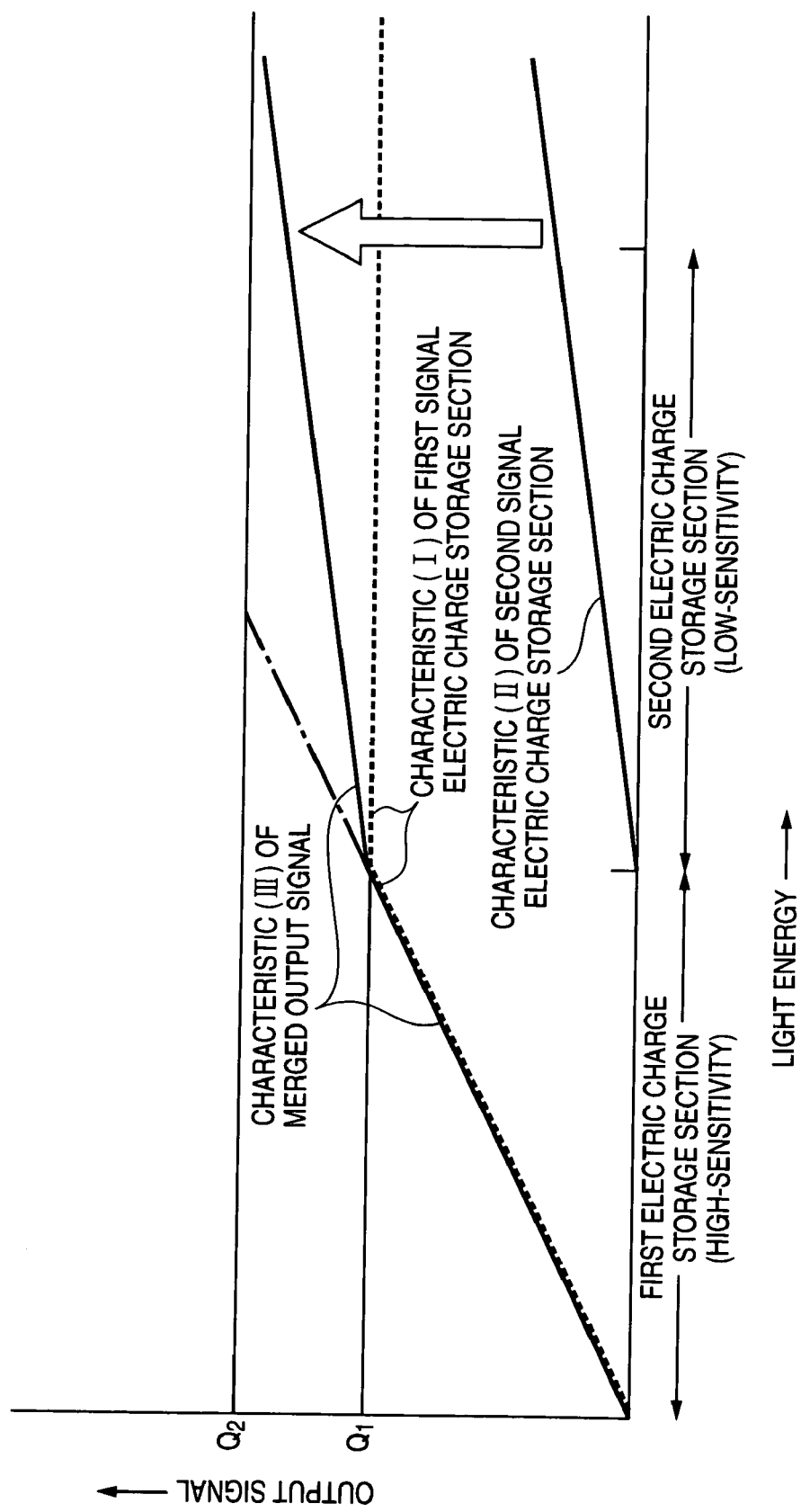
FIG. 9 is a graph of characteristic curve for describing incident light energy versus an output signal of the solid-state imaging device of the first embodiment of the invention shown in FIG. 1.

FIG. 9 is a graph showing characteristics curves of incident light energy versus signal output by the solid-state imaging device of the present embodiment. A characteristic line I shown in FIG. 9 shows a characteristic of the signal "S" corresponding to the amount of electric charge "q" stored in the first signal electric charge storage section 31, and the output signal increases with the increase of amount of incident light energy (i.e., the amount of stored signal electric charge "q"). However, when the amount of stored electric charge "q" has reached the amount of saturated electric charge Q1 of the first signal electric charge storage section 31, the electric charges in excess of that amount cannot be stored in the first signal electric charge storage section 31.

A characteristic line II shown in FIG. 9 shows a characteristic of the signal "S'" corresponding to the amount of electric charge "q'" stored in the second signal electric charge storage section 32. During a period in which the amount of signal electric charge "q" corresponding to incident light energy is stored in the first signal storage section 31, the signal electric charge "q'" is not stored in the second signal electric charge storage section 32. After the electric charges stored in the first signal electric charge storage section 31 have overflowed, the amount of stored electric charge "q'" gradually increases. Specifically, when higher incident light energy—which is greater than the light intensity which saturates the first signal electric charge storage section 31—has entered the light-receiving section, the signal electric charge "q'" corresponding to the amount of excess incident light is stored in the second signal electric charge storage section 32.

A characteristic line III shown in FIG. 9 shows an output characteristic of the solid-state imaging device of the present embodiment. Specifically, the characteristic line II of the signal "S'" corresponding to the amount of electric charge "q'" stored in the second signal electric charge storage section 32 is merged into the characteristic line I of the signal "S" corresponding to the amount of electric charge "q" stored in the second signal electric charge storage section 31, as an output value for a period of time subsequent to the point in time at which the first signal electric charge storage section 31 has become saturated. Therefore, the solid-state imaging device of the present embodiment can obtain an output signal level corresponding to incident light energy even in the case where the amount of electric charges which is several times to hundreds of times the amount of saturated electric charges in the first signal electric charge storage section 31, depending on the area of the second signal electric charge storage section 32 and the concentration of impurity dopant in the $P^+$ layer 36, thereby significantly broadening the dynamic range.

For instance, the ratio of the amount of electric charges to be stored in the second signal electric charge storage section 32 to the amount of excess electric charges to be discarded to the substrate is assumed to be designed as 1:4. In this case, even when electric charges, which are four times the quantity of the saturated electric charges of the second signal electric charge storage section 32, are discharged, a limitation is imposed on the rate of increase in the signal output from the second signal electric charge storage section 32. Accordingly, a point at which the signal output from the solid-state imaging device becomes saturated can be increased by a factor of about four times even in the case of higher-intensity incident light, and hence an output signal level corresponding to the incident light can be obtained over a wide range of incident light energy.

In this case, when reading of the signal electric charges from the signal electric storage sections to the vertical electric charge transfer channel, transfer of the electric charges, and output of a signal are frame-sequentially performed; that is, when the electric charges are read from the second signal electric charge storage section 32 after all the electric charges stored in the first signal electric charge storage section 31 have been read, there is no necessity for increasing the charge transfer capacity of the vertical electric charge transfer channel. Even when the area of the light-receiving sections and the width of the vertical electric charge transfer channel are set as conventionally, the final intensity range of photographable incident light can be broadened.

Even when the electric charges stored in the first signal electric charge storage section 31 and those stored in the second signal electric charge storage section 32 are mixed together on the vertical transfer channel. The amount of electric charges stored in the second signal electric charge storage section 32 is much less than that of over-flowed down to the substrate, hence, the dynamic can be significantly broadened by means of a slight increase in the capacity or width of the vertical charge transfer channel.

As mentioned above, in the present embodiment, the signal electric charges are stored in the second signal electric charge storage section 32 while the photoelectric conversion efficiency is set low, in a higher-energy (higher-intensity) side of incident light energy, and hence the slope of the characteristic curve becomes gentle. Consequently, the saturation point of the output signal can be set to a point in the higher-energy side even in the case of incident light energy which is four times or more a conventional saturated exposure level, and hence image under high lighted reproduces details without showing solid or saturated white.

The previously-described embodiment has been described by means of taking as an example a digital still camera having a mechanical shutter. However, an analogous effect can be yielded by means of providing a common digital camera having not a mechanical shutter but an electronic shutter with the solid-state imaging device of the present embodiment.

In the embodiment, the electric charges stored in the first signal electric charge storage section 31 and those stored in the second signal electric charge storage section 32 are separately read and additionally merged together by means of signal processing. However, the signal electric charges "q" and the signal electric charges "q'" may be mixed together and transferred over the vertical transfer channel and output from the solid-state imaging device.

In the embodiment, the signal electric charge is not stored in the second signal electric charge storage section 32 until the first signal electric charge storage section 31 becomes saturated, and the amount of electric charges stored in the second signal electric storage section 32 corresponds to that achieved by decreasing a portion of the excess electric charges saturated in the first signal electric charge storage section 31; that is, by decreasing by a given proportion the excess electric charges saturated in the first signal electric charge storage section 31. Therefore, the dynamic range can be broadened, by means of additionally merging together the electric charges stored in the first signal electric charge storage section 31 and those stored in the second signal electric charge storage section 32.

Second Embodiment

Figure 10:
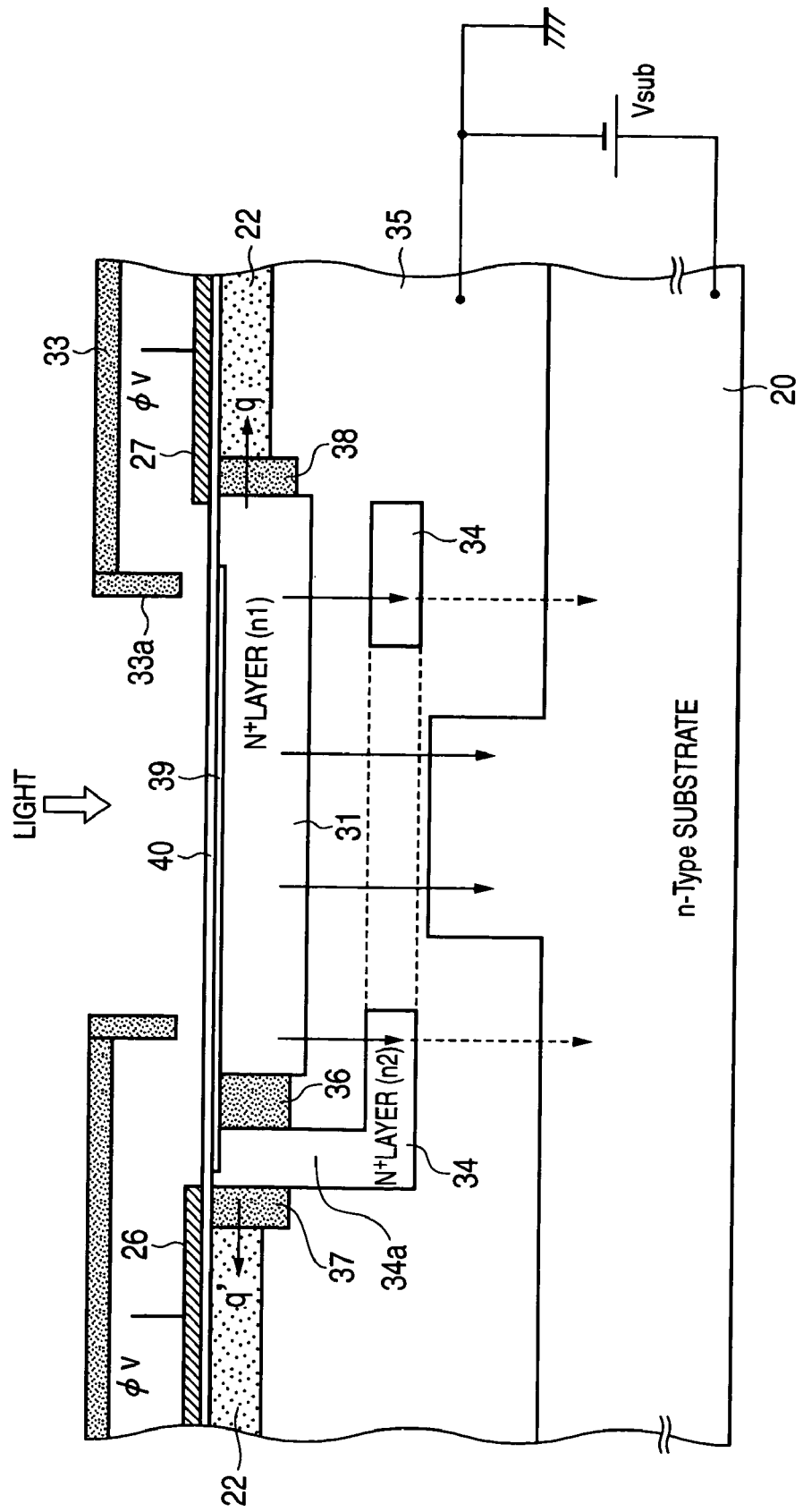
FIG. 10 is a cross-sectional view of one light-receiving section (pixel) of a solid-state imaging device according to a second embodiment of the invention.

FIG. 10 is a cross-sectional view of a light-receiving section of a solid-state imaging device according to a second embodiment of the invention and corresponds to FIG. 5 of the first embodiment. As in the case of FIG. 5, the color filter and the micro-lens are omitted from FIG. 10.

The present embodiment differs from the first embodiment in the following points. A second signal electric charge storage section 34 formed from an $N^+$ layer is provided at a deep position in the substrate below the first signal electric charge storage section 31 in place of the second signal electric charge storage section 32 of the first embodiment. The end section of the second signal electric signal storage section 34 is distributed to An $N^+$ layer 34a. The $P^+$ layer (read gate section) 37 is placed between the embedded channel 22 of the vertical transfer channel and an $N^+$ layer 34a.

In the second embodiment, the second signal electric charge storage section 34 is provided at a deep position in the depth-wise direction of the substrate. The concentration of impurity dopants in the second signal electric charge storage section 31 and the concentration of impurity dopants in the second signal electric charge storage section 34 are set to, e.g., $5 \times 10^{16}$ to $1 \times 10^{18}/cm^3$. The concentration of impurity dopants in the P type semiconductor ($P^+$) layer 36—which is provided in the vicinity of the surface of the substrate, separates the first and second signal electric charge storage sections 31, 34a from each other, and is of the opposite conductivity type—is set so as to be higher than the concentration of impurity dopants in the P well layer and equal to or higher than the concentration of the impurity dopants in the read gate section 37. The concentration of impurity dopants in the P well layer 35 is set to, e.g., $1 \times 10^{14}$ to $5 \times 10^{15}/cm^3$. The concentration of impurity dopants in the read gate sections 37, 38 is set to, e.g., $5 \times 10^{15}$ to $1 \times 10^{17}/cm^3$.

In the embodiment, the concentration of impurity dopants is set such that the electric charges stored in the first signal electric charge storage section 31 are not diffused laterally into the second signal electric charge storage section 34a by way of the $P^+$ layer 36.

In the embodiment, the area of the second signal electric charge storage section 34 is set so as to become smaller than that of the first signal electric charge storage section 31. The second signal electric charge storage section 34 is placed among the P-well and partially disposed between the first signal electric charge storage section 31 and n-type substrate 20 which the excessive charges are wiped away from the first signal electric charge storage section 31 to the substrate 20 by means of the vertical overflow drain structure. Portions of the excess electric charges over-flowed from the first signal electric charge storage section 31 are stored in the second signal electric charge storage section 34. The amount of electric charges stored in the second signal electric charge storage section 34 is determined by the previously described, for example, n1 and n2 area ratio. Further, the present embodiment also has a characteristic of the ability to control the amount of electric charges stored in the second signal electric charge storage section 34 by changing the bias voltage Vsub.

The present embodiment yields the advantage of the ability to readily discharge excess electric charges to the substrate 20 by means of the vertical overflow drain structure even when the electric charges stored in the second signal electric charge storage section 34 have become saturated, as well as the advantage of preventing mixing of the excess electric charges into a peripheral pixel even when an excessively-higher-intensity light has entered the light-receiving section.

Figure 11:
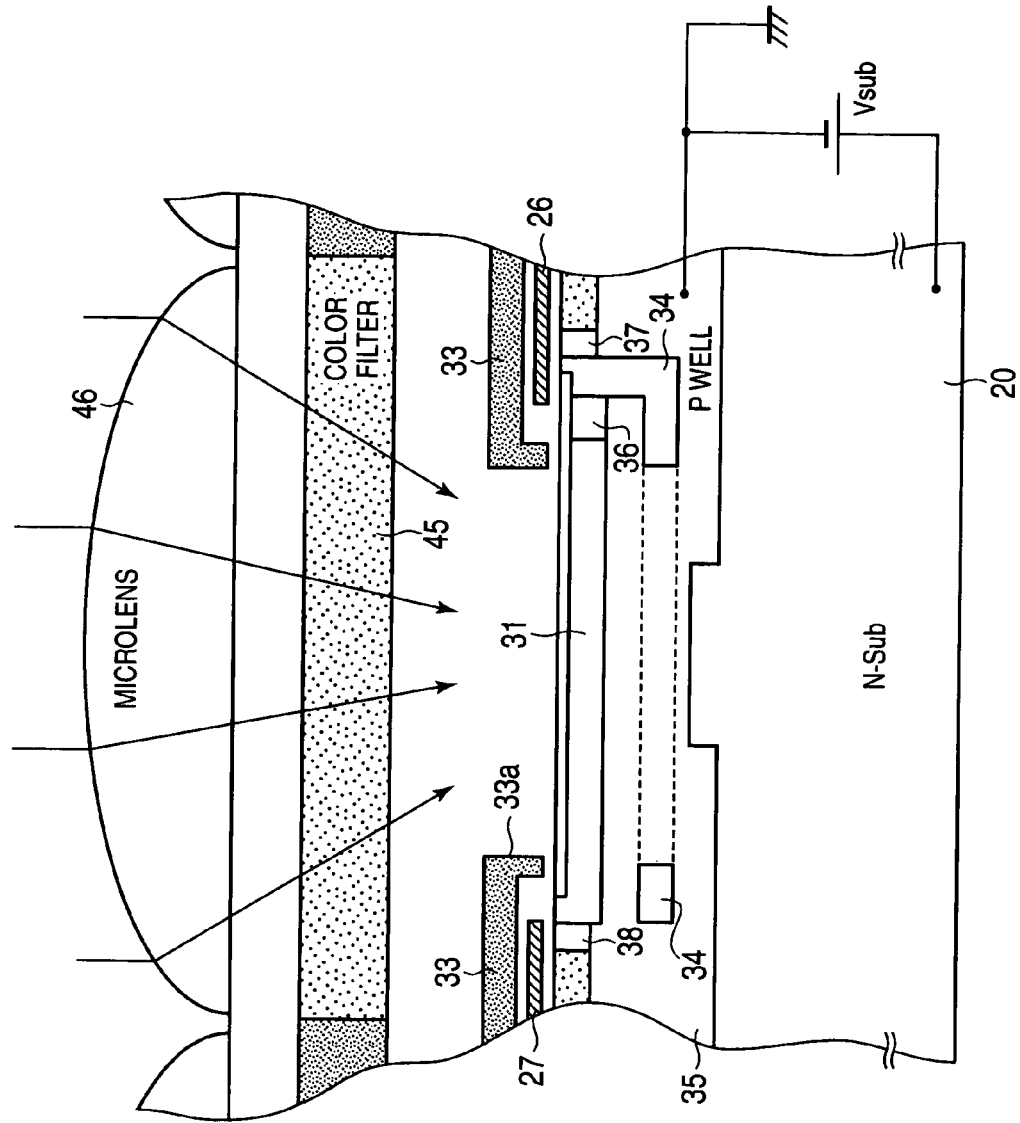
FIG. 11 is a view for describing a modification of the embodiment shown in FIG. 10.

The embodiment shown in FIG. 10 is configured such that an end section of a portion of the second signal electric charge storage section 34 protrudes to a position located immediately below the opening section 33a. The second electric charge storage section 34 is preferably placed not at a position immediately below the opening section 33a of the light-shielding film 33 but at, e.g., an area completely shielded by the light-shielding film 33, as shown in FIG. 11. As a result, the second signal electric charge storage section can be made resistant to the influence of incident light or stray light reaching a deep section.

FIG. 11 illustrates a color filter 45 and one on-chip optical system (a micro-lens 46 in the present embodiment) for one opening (but omitted from FIG. 10). As a result of the solid-state imaging device being provided with the on-chip optical system, the incident light can be converged on the opening section 33a, thereby diminishing a loss of incident light and enabling an attempt to increase sensitivity.

More preferably, the concentration profile of impurity dopants in the second signal electric charge storage section 34 is provided with a concentration gradient such that the concentration becomes higher with increasing proximity to the read gate section 37. For instance, the concentration of impurity dopants is set to $1\times10^{17}$ to $1\times10^{19}/cm^3$ in the vicinity of the read gate section 37. As a result, complete charge transfer from charge storage section 34 to the vertical charge transfer channel is facilitated, and residual electric charges in the charge storage section 34 can be minimized.

Figure 12:
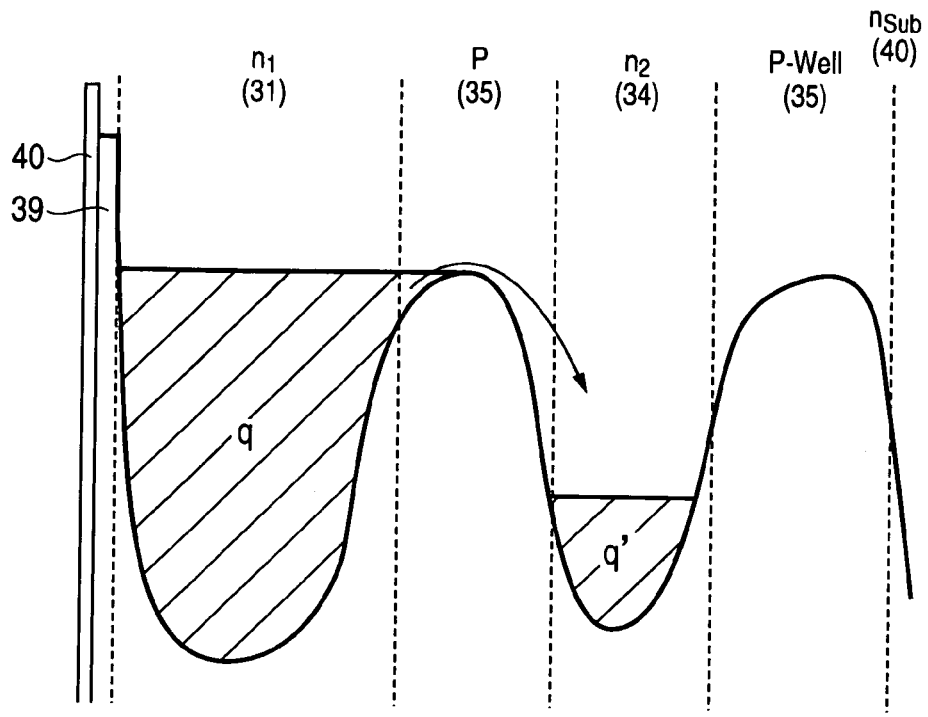
FIG. 12 is a view showing a potential profile existing in the solid-state imaging device of the second embodiment.
Figure 12:
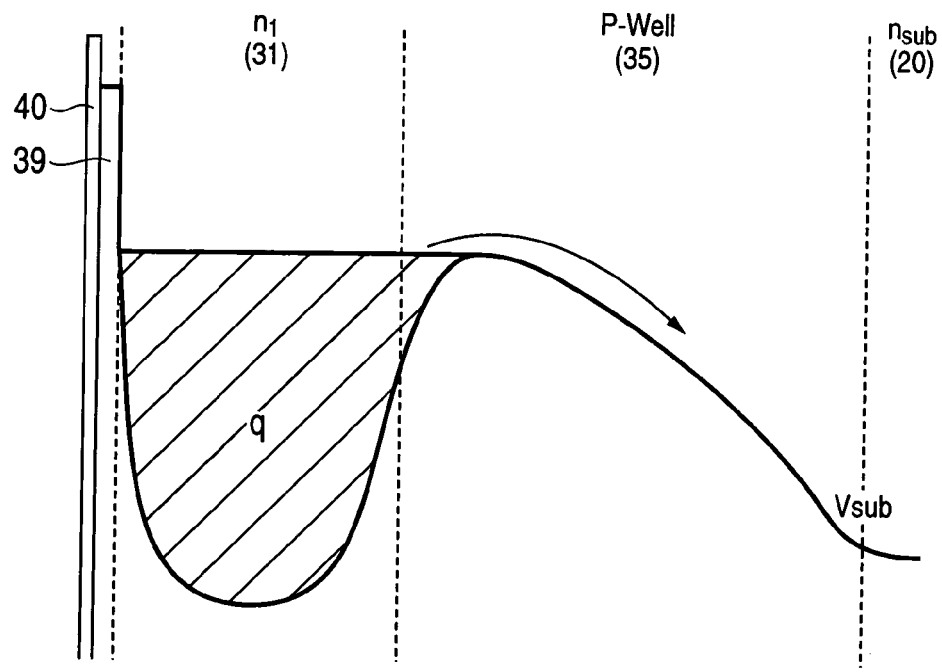

FIG. 12A shows a potential profile existing in a depth-wise direction of the substrate at a position where the second signal electric charge storage section 34 of the solid-state imaging device of the second embodiment is present below the first signal electric charge storage section 31. FIG. 12b shows a potential profile existing in a depth-wise direction of the substrate at a position where the second signal electric charge storage section 34 of the solid-state imaging device of the second embodiment is not present below the first signal electric charge storage section 31.

When the amount of electric charges stored in the first signal electric charge storage section 31 becomes saturated as a result of the amount of incident light having become excessive and, as a result, excess electric charges are discharged to the substrate 20, portions of the excess electric charges are stored in the second signal electric charge storage section 34, as shown in FIG. 12A, within the area where the second signal electric storage section 34 is formed at a position close to the substrate 20. In contrast, the excess electric charges are discarded to the substrate 20, as shown in FIG. 12B, within the area where the second electric charge storage section 34 is not formed.

As a result, even in this embodiment, an output signal can be obtained with respect to an amount of electric charges which is several times to hundreds of times as large as the amount of saturated electric charges of the first signal electric charge storage section 31.

In the embodiment, the second signal electric charge storage section 34 is distributed in the depth-wise direction of the substrate and optically shielded by the light-shielding film 33. Hence, there is a merit of smaller unit pixel size than that of the first embodiment which requires additional area for the second signal electric charge storage section.

Third Embodiment

Figure 13:
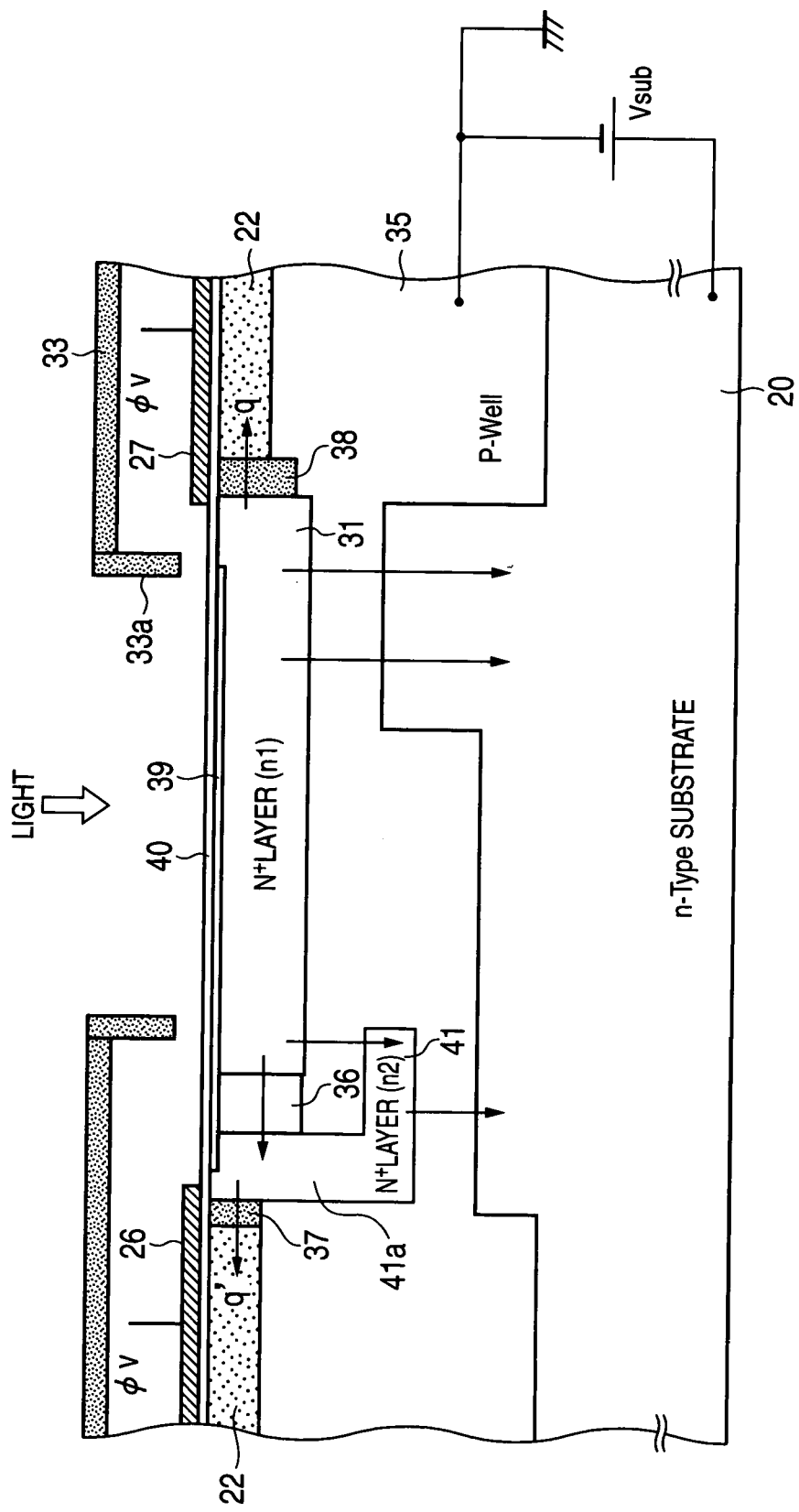
FIG. 13 is a cross-sectional view of one light-receiving section (pixel) of a solid-state imaging device according to a third embodiment of the invention.

FIG. 13 is a cross-sectional view of a light-receiving section of a solid-state imaging device according to a third embodiment of the invention and corresponds to FIG. 10 of the second embodiment. As in the case of FIG. 10, the color filter and the micro-lens are omitted from FIG. 13.

The present embodiment differs from the second embodiment in that a second signal electric charge storage section 41 is provided in place of the second signal electric storage section 34 of the second embodiment. The shape of the second signal electric charge storage section 41 differs from that of the second signal electric charge storage section 34 shown in FIG. 10. This difference is attributable to the fact that the ratio of the area of the second signal electric charge storage section 41 to the area of the first signal electric charge storage section 31 is made smaller than that described in connection with the second embodiment. In the present embodiment, the second signal electric charge storage section 41 is provided at a position where it is completely shielded by the light-shielding film 33. The present embodiment is characterized by being configured to have the characteristics of both the first and second embodiments.

The present embodiment is characterized in that portions of the excessive electric charges having overflowed from the first signal electric charge storage section 31 are captured by the second electric charge storage section 41 provided at a position below the first signal electric charge storage section 31 and in that portions of the excess electric charges that have overflowed from the first signal electric charge storage section 31 and diffused laterally by way of the $P^+$ layer 36 are captured by the second signal electric charge storage section 41.

In the embodiment, storage of the electric charges in the second signal electric charge storage section 41 is dominated primarily by laterally-diffusing components of the excessive electric charges. However, the excess electric charges of the first signal electric charge storage section 31 and those of the second signal electric charge storage section 41 can be simultaneously discharged to the substrate 20 by way of a vertical overflow drain structure by means of the bias voltage of the substrate. For this reason, an attempt can be made to broaden the dynamic range and facilitate control of the dynamic range characteristics.

Fourth Embodiment

Figure 14:
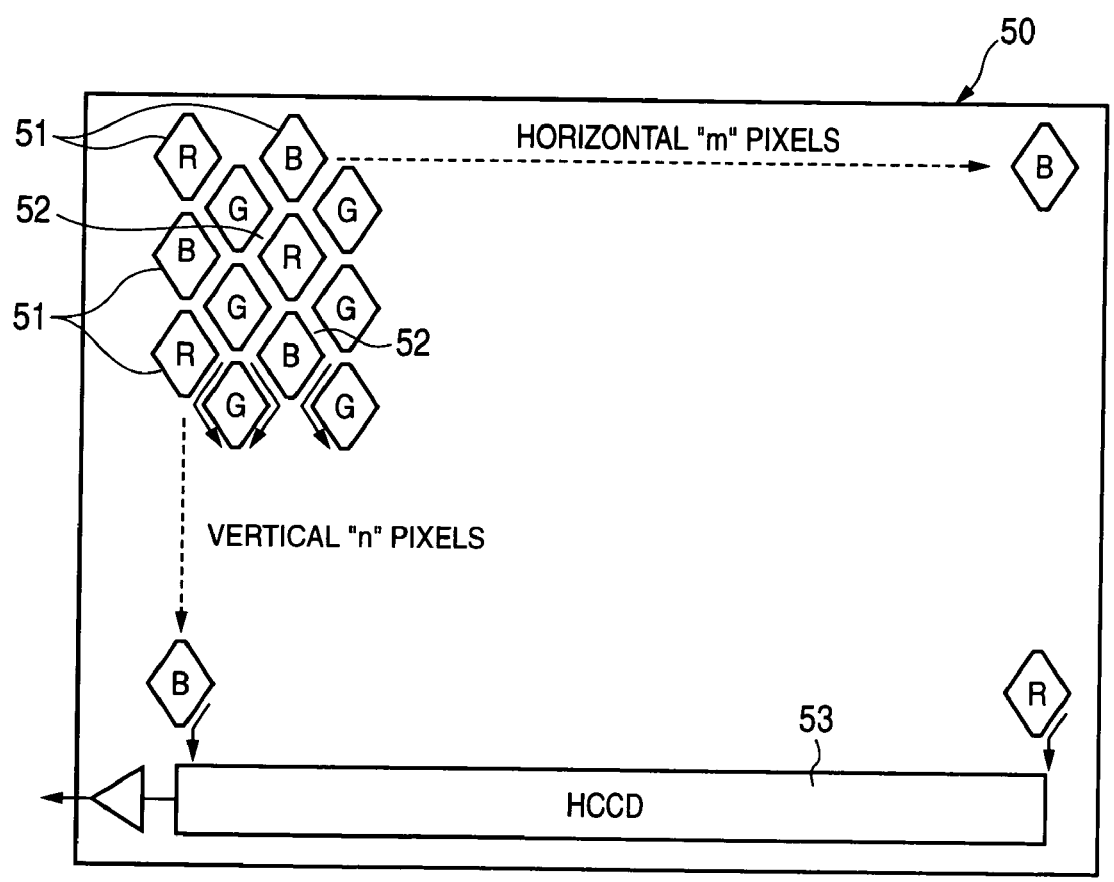
FIG. 14 is a surface schematic view of a CCD color solid-state imaging device according to a fourth embodiment of the invention.

FIG. 14 is a surface schematic view of a CCD color solid-state imaging device of single chip type according to a fourth embodiment of the invention. Like the solid-state imaging device of the first embodiment shown in FIG. 1, this CCD color solid-state imaging device has a plurality of light-receiving sections 51 arranged in an array pattern on the surface of a semiconductor substrate 50. In the illustrated embodiment, each of the light-receiving sections 51 is formed in the shape of a rhombus and functions as a unit pixel.

A layout of the pixels employed in the embodiment is a pixel layout described in JP-A-10-136391; that is, a so-called honeycomb pixel layout in which the respective light-receiving sections 51 are arranged in both vertical and horizontal directions while being offset from each other by one-half pitch. A vertical transfer channel (VCCD) 52 is formed between adjacent light-receiving sections 51. Signal electric charges "q" and "q'" read from the respective light-receiving sections 51 to the vertical transfer channel 52 are downwardly transferred to a horizontal transfer channel (HCCD) 53 while meandering over the drawing.

The respective light-receiving sections 51 store electric charges "r", "g", and "b" (collectively called "q") of three colors, i.e., red (R), green (G), and blue (B), and portions of excess electric charges "r'", "g'", and "b'" (collectively called "q'"). Signal electric charges "q" and "q'" of respective colors are separately read to the vertical transfer channel 52.

Figure 15:
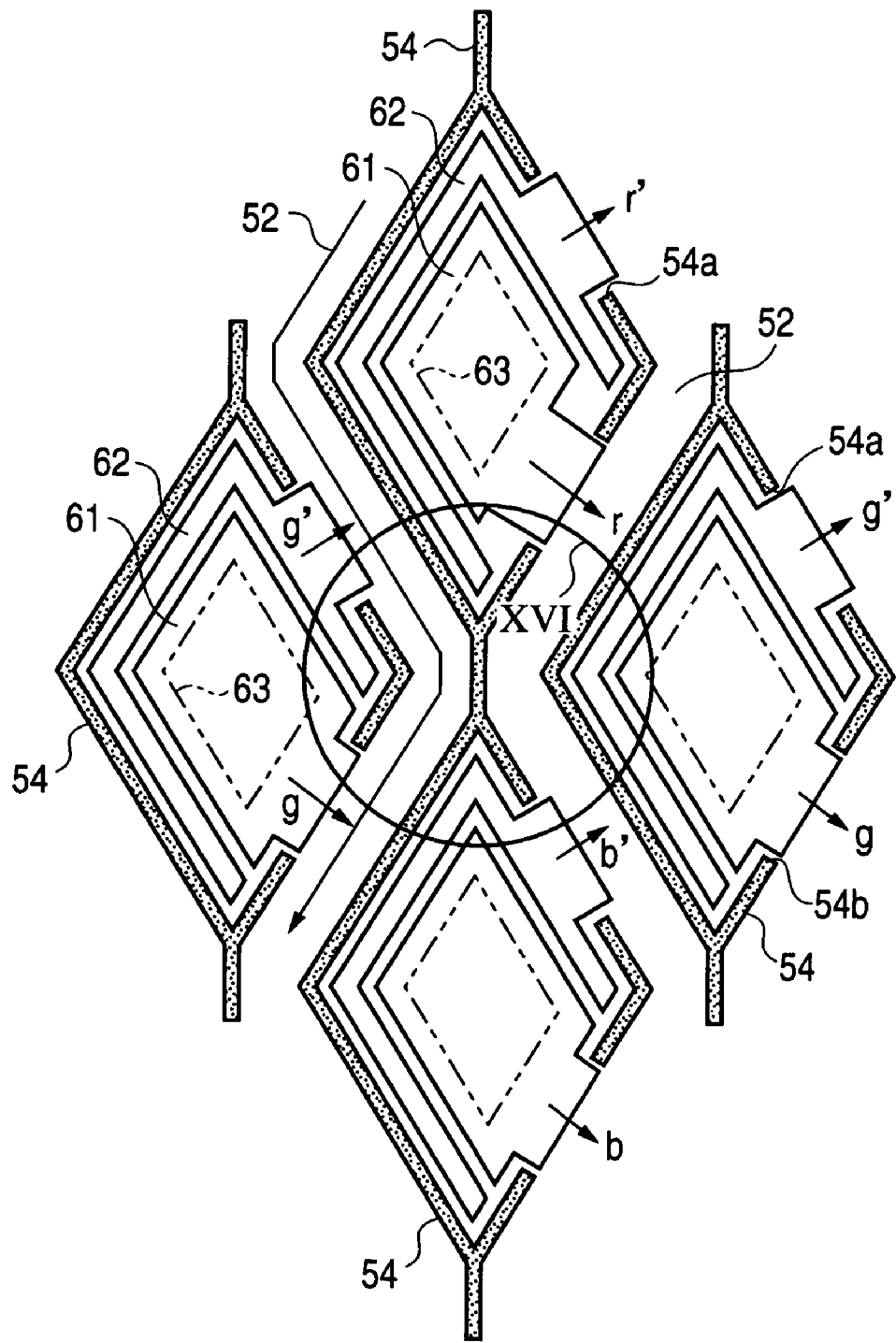
FIG. 15 is an enlarged descriptive view of four light-receiving sections shown in FIG. 13.

FIG. 15 is a plan view showing the light-receiving sections 51, which are shown in FIG. 14 and correspond to four pixels, and a detailed pattern of the vertical transfer channel 52 between the light-receiving sections 51. Each of the light-receiving sections 51 is defined by a rhombus element isolation zone 54, and gate sections 54a, 54b are formed in the two right-hand sides from among four sides of the rhombus in the illustrated embodiment, wherein the element isolation zone 54 is broken at the gate sections 54a, 54b.

A first signal electric charge storage section 61 of a plano-rhombus shape is formed in the center of each of the light-receiving sections 51. A second signal electric charge storage section 62 is formed so as to surround the first signal electric charge storage section 61. The electric charges q' of the second signal electric charge storage section 62 are read from the gate section 54a to the vertical transfer channel 52. The electric charges "q" stored in the first signal electric charge storage section 61 are read from the gate section 54b to the vertical transfer channel 52. A rhombus section 63 illustrated by a phantom line in the first signal electric charge storage section 61 depicts an opening section of the light-shielding film.

Figure 16:
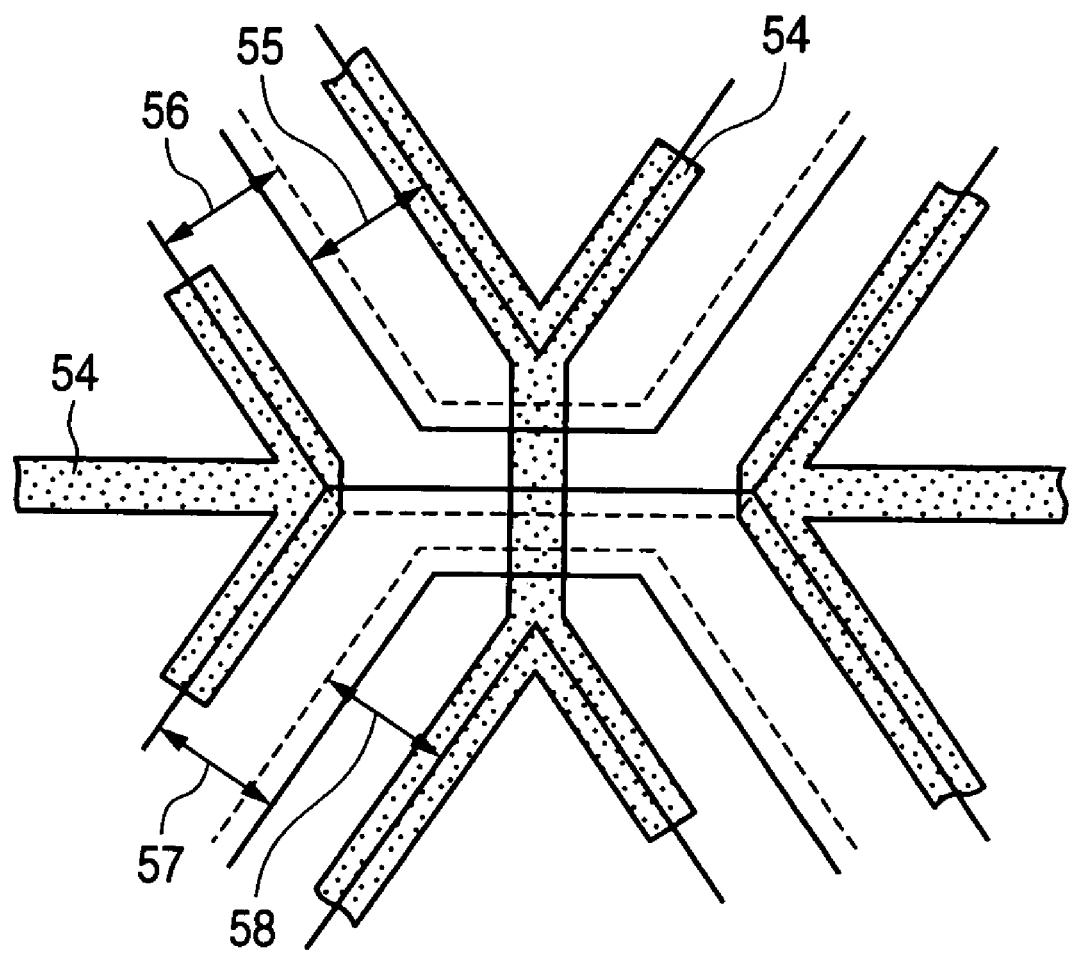
FIG. 16 is a view showing a transfer electrode located within a circle XVI shown in FIG. 14.

FIG. 16 is a view showing transfer electrodes provided within a range indicated by a circle XVI shown in FIG. 15. The charge transfer electrodes of the embodiment are formed from a two-layered poly-silicon structure and laid on the vertical transfer channel 52. Four phase charge transfer electrodes 55, 56, 57, and 58 are provided for one light-receiving section 51, which enables so called "progressive read operation".

Like the second signal electric charge storage section 32 of the first embodiment, the second signal electric charge storage section 62 of the fourth embodiment is provided on only the surface of the semiconductor substrate. As a matter of course, as in the case of the second and third embodiments, there may be adopted a structure in which the second signal electric charge storage section is distributed in a depth-wise direction of the substrate, to thus capture portions of excess electric charges discharged to the substrate by way of the overflow drain.

Figure 17:
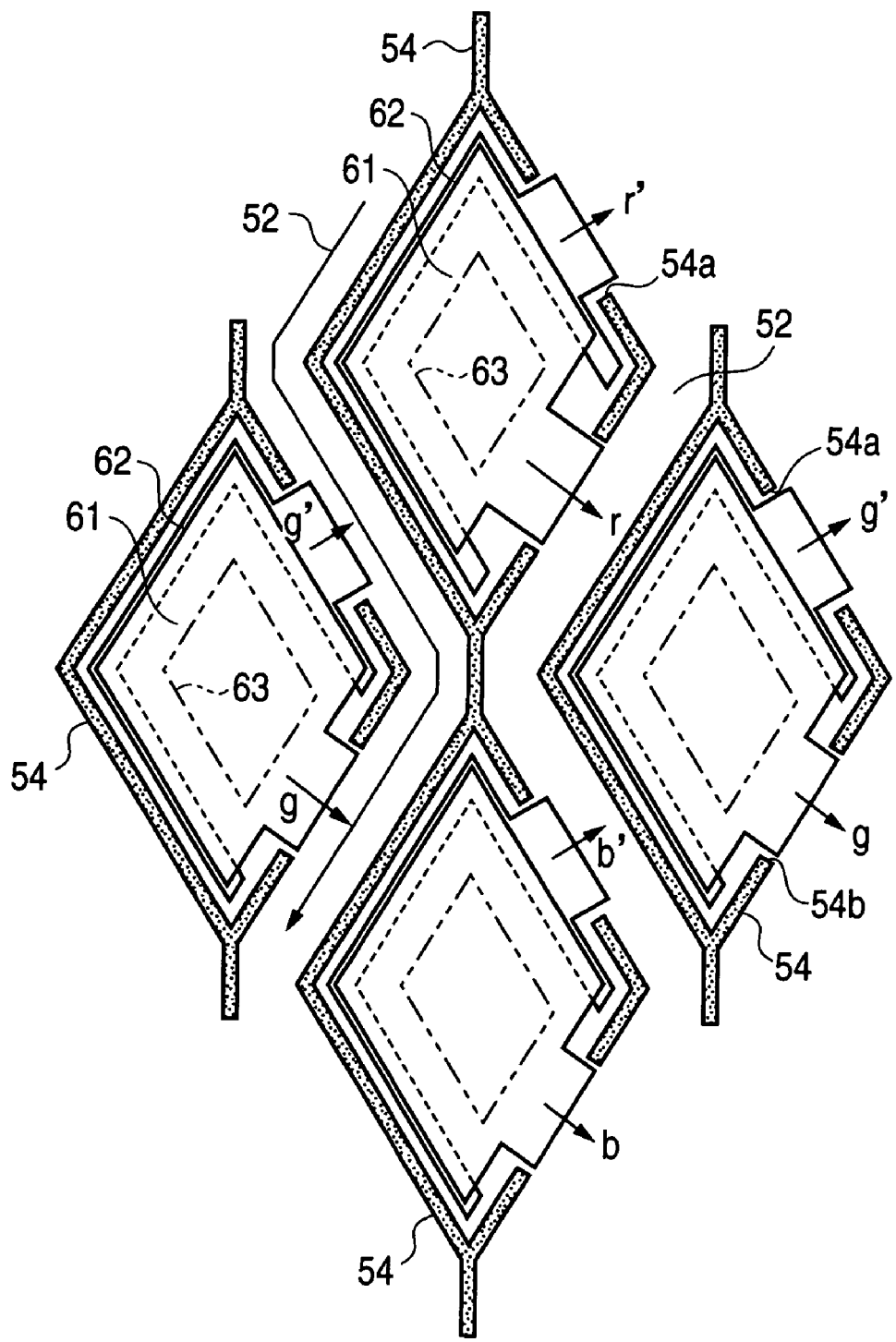
FIG. 17 is a view showing a modification of the embodiment shown in FIG. 15.

FIG. 17 is a surface view showing a modification in which the second signal electric charge storage section 62 is distributed in a depth-wise direction of the substrate, as in the case of the second and third embodiments. As can be seen from FIG. 17, the second signal electric distribution storage section 62 is distributed in the depth-wise direction of the substrate, and hence the area on the surface of the substrate where the second signal electric charge storage section 62 becomes exposed can be diminished, thereby broadening the area of a first signal electric charge storage section 61 up to the thus-diminished area. Therefore, the utilization factor of the surface of the substrate can be increased.

The present embodiment has the merit of ability to manufacture a CCD which can read all pixels (can perform progressive operation) despite having a two-layered poly-silicon structure. Further, as is evident from FIG. 14, a boundary portion existing between the light-receiving section 51 and the vertical transfer channel 52 can be made wider than that in a conventional CCD having a square lattice pattern shown in FIG. 1. Hence, there is yielded an advantage of facilitating provision of a plurality of read gate sections 54a, 54b (for instance, two readgate sections of 54a, 54b in this embodiment).

The embodiment yields an advantage of facilitating provision of the second signal electric charge storage section ($N^+$ area) 62 so as to surround the first signal electric charge storage section ($N^+$ area) 61 and an advantage of the ability to accurately control the possibility of inflow of excess electric charges of the first signal electric charge storage section 61 into the second signal electric charge storage section 62.

The present invention yields the following advantages:

(1) There is obtained a solid-state imaging device having uniform sensitivity which has less angle dependency of incident light, improved brightness or color shading phenomena, and having a wide dynamic range.

(2) There is obtained a solid-state imaging device having complete electronic shutter function (all pixel data can be read out to vertical charge transfer channels simultaneously) and a wide dynamic range.

(3) There is obtained a solid-state imaging device which is easy to set the amount of saturated exposure level, which is ten times to hundreds of times as large as a saturation level of a related prior art imaging device.

(4) Merging algorithm of two characteristic curves such as a characteristic curve of a high-sensitivity region and a characteristic curve of a low-sensitivity region is simplified.

(5) There is obtained a solid-state imaging device which achieves both future pixel miniaturization (i.e., an increase in the number of pixels) and widening a dynamic range.

The entire disclosure of each and every foreign patent application from which the benefit of foreign priority has been claimed in the present application is incorporated herein by reference, as if fully set forth.

What is claimed is:

1. A solid-state imaging device comprising: a semiconductor substrate having a first surface; and a plurality of light-receiving sections arranged in an array pattern on the first surface of the semiconductor substrate, the solid-state imaging device reading a stored electric charge in each of the light-receiving sections, wherein each of the light-receiving sections comprises:
a first signal electric charge storage section that stores a first signal electric charge corresponding to an incident light energy; and
a second signal electric charge storage section that stores at least part of an excessive electric charge, said at least part of the excessive electric charge being captured from the first signal electric charge storage section, when the electric charge stored in the first signal electric charge storage section exceeds a saturated electric charge amount of the first signal electric charge storage section to form the excessive electric charge.

2. The solid-state imaging device according to claim 1, wherein the second signal electric charge storage section is disposed adjacent to the first signal electric charge storage section isolated from potential barrier, on the first surface of the semiconductor substrate.

3. The solid-state imaging device according to claim 2, further comprising:
a P-well layer on the semiconductor substrate;
a first read gate section for the first signal electric charge storage section; and
a second read gate section for the second signal electric charge storage section,
wherein the impurity dopant concentration in the potential barrier is higher than the impurity dopant concentration in the P-well layer, and lower than each of the impurity dopant concentrations of the first and second read gate sections.

4. The solid-state imaging device according to claim 2, further comprising:
a first read gate section for the first signal electric charge storage section; and
a second read gate section for the second signal electric charge storage section,
wherein the impurity dopant concentration in the potential barrier has the same level of each of the impurity dopant concentrations of the first and second read gate sections.

5. The solid-state imaging device according to claim 1, wherein the second signal electric charge storage section is disposed vertically in a depth direction of the first signal electric charge storage section with respect to the semiconductor substrate.

6. The solid-state imaging device according to claim 5, further comprising:
a second read gate section for the second signal electric charge storage section,
wherein the second signal electric charge storage section has a impurity dopant profile that the impurity dopant concentration near the second read gate is higher than that of a deeper portion of the second signal electric charge storage section.

7. The solid-state imaging device according to claim 1, wherein the solid-state imaging device is an electric-charge coupled device (CCD);
wherein the solid-state imaging device comprises: a first read gate section for the first signal electric charge storage section; and a second read gate section for the second signal electric charge storage section; and
wherein the first and second read gate sections are disposed separately from each other.

8. The solid-state imaging device according to claim 1, further comprising a light-shielding film having at least one opening section, wherein the second signal electric charge storage section is disposed at a position that is below the light-shielding film and avoids each of the at least one opening section.

9. The solid-state imaging device according to claim 8, wherein the second signal electric charge storage section is disposed so as to surround the first signal electric charge storage section.

10. The solid-state imaging device according to claim 1, wherein the second signal electric charge storage section is smaller in area than the first signal electric charge storage section.

11. The solid-state imaging device according to claim 1, further comprising:
an on-chip micro-lens system provided above each of the plurality of light-receiving sections; and
a light-shielding film having at least one opening section, each of the at least one opening section corresponding to each of the plurality of light-receiving sections.

12. The solid-state imaging device according to claim 7, wherein the light-receiving sections are arranged in a honeycomb pattern.

13. A method for driving the solid-state imaging device according to claim 1, comprising:
reading a first electric charge signal in the first signal electric charge storage section and a second electric charge signal in the second signal electric charge storage section, independently.

14. The method for driving according to claim 13, wherein the first electric charge signal and the second electric charge signal are separately and frame-sequentially read to a vertical transfer channel and then independently transferred and output to the vertical horizontal transfer channel and a horizontal transfer channel.

15. A method for processing an image signal by use of a first output signal from the first signal electric charge storage section and a second output signal from the second signal electric charge storage section in the method for driving according to claim 14, the method for processing comprising:
merging the first output signal into the second output signal with respect to each of the light-receiving sections.

16. The method according to claim 13,
wherein the first electric charge signal and the second electric charge signal are read to a vertical transfer channel to cause a mixed signal, where the first and second electric charge signals are mixed together in the vertical transfer channel; and
wherein the mixed signal is transferred down to the horizontal transfer channel, and is output from the solid-state imaging device.

* * * * *